US007073251B2

(12) United States Patent
Kikuchi et al.

(10) Patent No.: US 7,073,251 B2
(45) Date of Patent: Jul. 11, 2006

(54) DISASSEMBLING TOOL FOR PROCESS CARTRIDGE

(75) Inventors: Ken Kikuchi, Shizuoka (JP); Toshiyuki Karakama, Shizuoka (JP); Toru Oguma, Shizuoka (JP); Akiyoshi Yokoi, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 263 days.

(21) Appl. No.: 10/653,229

(22) Filed: Sep. 3, 2003

(65) Prior Publication Data

US 2004/0045156 A1 Mar. 11, 2004

(30) Foreign Application Priority Data

Sep. 6, 2002 (JP) ............................ 2002-260871

(51) Int. Cl.
*B23P 19/00* (2006.01)
*H05K 13/04* (2006.01)

(52) U.S. Cl. ........................... 29/729; 29/737; 29/750; 29/762; 399/109

(58) Field of Classification Search .................. 29/729, 29/737, 739, 751–766, 770, 603.03, 270; 399/109–115; 242/332.8, 532.6
See application file for complete search history.

(56) References Cited

U.S. PATENT DOCUMENTS 5,294,960 A 3/1994 Nomura et al. ............. 355/210
5,499,436 A * 3/1996 Merle et al. ................... 29/270
5,500,714 A 3/1996 Yashiro et al. .............. 355/200
5,543,898 A 8/1996 Shishido et al. ............ 355/210
5,617,579 A 4/1997 Yashiro et al. .............. 399/114
5,623,328 A 4/1997 Tsuda et al. ................ 399/111
5,689,774 A 11/1997 Shishido et al. ............ 399/111
5,749,027 A 5/1998 Ikemoto et al. ............. 399/113
5,774,766 A 6/1998 Karakama et al. .......... 399/111
5,828,928 A 10/1998 Sasago et al. .............. 399/111
5,878,310 A 3/1999 Noda et al. ................. 399/117
5,890,036 A 3/1999 Karakama et al. .......... 399/119
5,899,602 A 5/1999 Noda et al. ................. 399/111
5,920,752 A 7/1999 Karakama et al. .......... 399/111
5,940,658 A 8/1999 Yokoi et al. ................ 399/119
5,943,528 A 8/1999 Akutsu et al. .............. 399/110
5,966,566 A 10/1999 Odagawa et al. ........... 399/109
6,070,028 A 5/2000 Odagawa et al. ........... 399/104
6,097,909 A 8/2000 Watanabe et al. ........... 399/111
6,101,354 A 8/2000 Nakagawa et al. ......... 399/225
6,272,299 B1 8/2001 Numagami et al. ......... 399/111
6,427,318 B1 * 8/2002 Pfeiffer et al. ........... 29/603.03

(Continued)

FOREIGN PATENT DOCUMENTS

JP 2002-268510 9/2002
JP 2004101668 * 4/2004

*Primary Examiner*—Minh Trinh
(74) *Attorney, Agent, or Firm*—Fitzpatrick, Cella, Harper & Scinto

(57) ABSTRACT

The disassembling tool for a process cartridge has a base body, an engagement portion provided on the base body and adapted to be engaged with the process cartridge to thereby position the process cartridge, a pushing-out portion provided for movement relative to the base body for pushing out a coupling member, and a grip portion adapted to be gripped when the pushing-out portion is to be moved, and connected to the pushing-out portion, and the engagement portion is provided at a location opposed to the pushing-out portion in a movement direction in which the pushing-out portion is moved. Thereby, a process cartridge having a frame can be simply disassembled.

11 Claims, 21 Drawing Sheets

U.S. PATENT DOCUMENTS

| | | | | |
|---|---|---|---|---|
| 6,512,895 | B1 | 1/2003 | Sakurai et al. | 399/13 |
| 6,880,225 | B1 * | 4/2005 | West | 29/468 |
| 2002/0067930 | A1 | 6/2002 | Oguma et al. | 399/222 |
| 2002/0081125 | A1 | 6/2002 | Karakama et al. | 399/111 |
| 2002/0122674 | A1 | 9/2002 | Yokoi et al. | 399/113 |
| 2002/0131791 | A1 | 9/2002 | Yokoi et al. | 399/113 |
| 2003/0108358 | A1 | 6/2003 | Yokoi et al. | 399/109 |
| 2003/0113131 | A1 | 6/2003 | Watanabe et al. | 399/111 |

* cited by examiner

DISASSEMBLING TOOL FOR PROCESS CARTRIDGE

BACKGROUND OF THE INVENTION

1. Field of the Invention

This invention relates to a disassembling tool for disassembling a process cartridge detachably attached to an image forming apparatus such as a copying machine, a laser beam printer or a facsimile apparatus.

2. Related Background Art

In an image forming apparatus using an electrophotographic image forming process, there is adopted a process cartridge comprising an electrophotographic photosensitive member and process means for acting on the electrophotographic photosensitive member integrally made into a cartridge which is made detachably attachable to an image forming apparatus main body. According to this process cartridge system, the maintenance of the image forming apparatus can be done by a user himself without resort to a serviceman and therefore, the usability of the image forming apparatus is markedly improved.

As the construction of such a process cartridge, there is one in which two frame bodies are coupled together. For example, a photosensitive member frame body for supporting a photosensitive drum, a charging device and a cleaning device, and a developing device frame body comprising a developing frame body for supporting developing means and a toner frame body having a toner chamber, the developing frame body and the toner frame body being joined together, are coupled together for rotation about a fulcrum. The two frame bodies are biased about the aforementioned fulcrum by a resilient member such as a spring to thereby determine the relative position of the photosensitive drum and the developing means. The functional merits of adopting the above-described construction are that the pressure force of a developing roller against the photosensitive drum can be made proper, and that the interval between the surface of the photosensitive drum and the surface of the developing roller can be maintained constant. Further, the use of the afore-described two frame bodies leads to many merits such as the facilitation of the molding of the frame bodies and the facilitation of assembly.

In the above-described conventional process cartridge, an engagement pin bringing a developing device unit and a photosensitive member unit into engagement with each other is required to have sufficient withstanding pull-out strength to ensure the engagement between the two units. Also, the engagement pin is installed so as to be fully embedded in a holding portion so that the user may not pull out the engagement pin by mistake.

To disassemble the process cartridge, the engagement pin coupling the two units together is pulled out, and the process cartridge is disassembled into the developing device unit and the photosensitive member unit.

SUMMARY OF THE INVENTION

It is an object of the present invention to provide a disassembling tool which can easily disassemble a process cartridge having a first frame and a second frame.

It is another object of the present invention to provide a disassembling tool which can simply detach a coupling member rotatably coupling a first frame and a second frame together.

It is another object of the present invention to provide a disassembling tool which can be easily positioned relative to a process cartridge, and can reliably detach a coupling member rotatably coupling a first frame and a second frame together.

It is another object of the present invention to provide a disassembling tool which can simply push a coupling member out of a process cartridge.

It is another object of the present invention to provide a disassembling tool for pushing a coupling member out of a process cartridge detachably attachable to an image forming apparatus main body and having an electrophotographic photosensitive member, process means for acting on the electrophotographic photosensitive member, a first frame, a second frame and the coupling member for rotatably coupling the first frame and the second frame together, the disassembling tool having a base body, an engagement portion provided on the base body and adapted to be engaged with the process cartridge to thereby position the process cartridge when the disassembling tool is mounted on the process cartridge, a pushing-out portion provided for movement relative to the base body for pushing out the coupling member, and a grip portion adapted to be gripped when the pushing-out portion is to be moved, and connected to the pushing-out portion, the engagement portion being provided at a location opposed to the pushing-out portion in a movement direction in which the pushing portion is moved.

It is another object of the present invention to provide a disassembling tool for pushing a first and a second coupling member out of a process cartridge detachably attachable to an image forming apparatus main body, the process cartridge having an electrophotographic photosensitive member, process means for acting on the electrophotographic photosensitive member, a first frame, a second frame, the first coupling member provided on one end side of the electrophotographic photosensitive member in the lengthwise direction thereof for rotatably coupling the first frame and the second frame together, and the second coupling member provided on the other end side of the electrophotographic photosensitive member in the lengthwise direction thereof for rotatably coupling the first frame and the second frame together, the aforedescribed coupling members are to be pushed, the disassembling tool having a first base body, a first engagement portion provided on the first base body and adapted to be engaged with the process cartridge to thereby position the process cartridge when the disassembling tool is mounted on the process cartridge, a first pushing-out portion provided for movement relative to the first base body for pushing out the first coupling member, a second base body, a second engagement portion provided on the second base body and adapted to be engaged with the process cartridge to thereby position the process cartridge when the disassembling tool is mounted on the process cartridge, and a second pushing-out portion provided for movement relative to the second base body for pushing out the second coupling member, the first engagement portion being provided at a location opposed to the first pushing-out portion in a movement direction in which the first pushing-out portion is moved, and the second engagement portion being provided at a location opposed to the second pushing-out portion in a movement direction in which the second pushing-out portion is moved.

DESCRIPTION OF THE PREFERRED EMBODIMENT

Some embodiments of the present invention will hereinafter be described.

Figure 18:
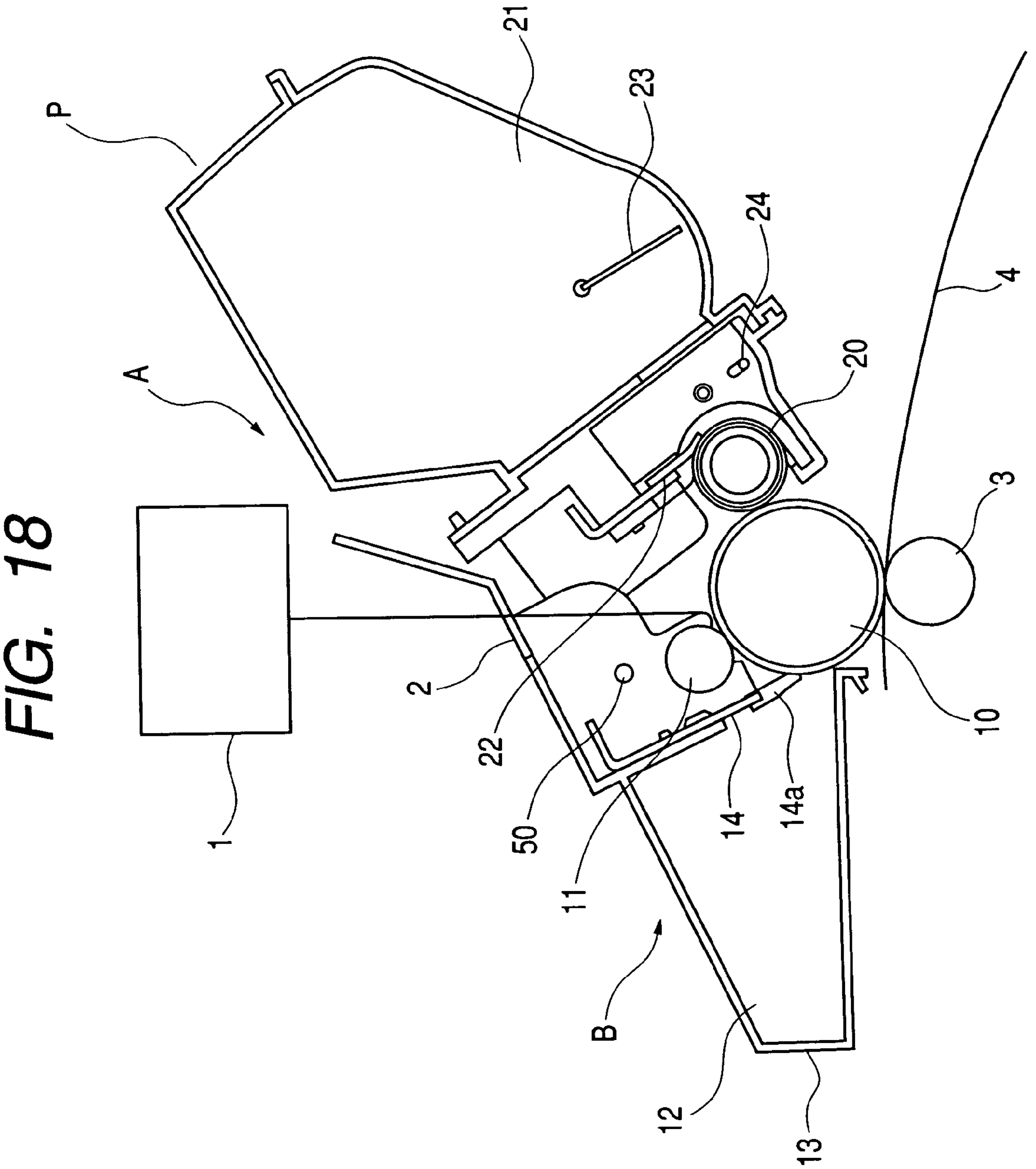
FIG. 18 is a cross-sectional view of a process cartridge to be disassembled by the disassembling tool according to the present invention.

FIG. 18 shows a cross-sectional view of a process cartridge P to be disassembled by the use of a disassembling tool which is an embodiment of the present invention.

In FIG. 18, in the photosensitive member unit B of the process cartridge P, there are disposed a photosensitive drum 10 as an electrophotographic photosensitive member on which an electrostatic latent image is to be formed, a charging device 11 for uniformly charging the surface of the photosensitive layer of the photosensitive drum, and cleaning means 14 for scraping off any residual toner adhering onto the photosensitive drum 10 from the surface of the photosensitive drum 10, and storing it in a waste toner container 12.

Also, in a developing device unit A, there are disposed a toner container 21 as process means containing a toner therein, a developing roller 20 as process means for supplying the toner to the electrostatic latent image formed on the photosensitive drum 10 to thereby form a visible image, and a developing blade 22 as process means for imparting triboelectrification charges to the toner to thereby form a toner layer on the surface of the developing roller 20.

Now, in FIG. 18, the photosensitive drum 10 is rotated clockwise. A predetermined voltage is applied to the charging device 11, and when the photosensitive drum 10 contacts the charging device 11, the surface of the photosensitive layer of the photosensitive drum 10 is uniformly charged. Then, a laser beam conforming to image information from an optical system 1 is applied onto the photosensitive drum 10 through an exposure opening portion 2 formed in a cleaning frame body 13 to thereby form an electrostatic latent image on the photosensitive drum 10. Thereafter, a toner image is formed on the photosensitive drum 10 by developing means.

Here, the developing means feeds the toner in the toner container 21 to the developing roller 20 by the rotation of a toner feeding member 23. The developing roller 20 containing a stationary magnet therein is then rotated. Then, a toner layer having triboelectrification charges imparted thereto by the developing blade 22 is formed on the surface of the developing roller 20, and the toner is supplied to the developing area of the photosensitive drum 10. The toner is shifted to the photosensitive drum 10 in conformity with the aforementioned electrostatic latent image to thereby form a toner image. Here, the developing blade 22 prescribes the amount of toner on the peripheral surface of the developing roller 20 and also imparts triboelectrification charges thereto. Also, a toner agitating member 24 for circulating the toner in a developing chamber is rotatably mounted near the developing roller 20.

A voltage opposite in polarity to the aforementioned toner image is applied to a transferring roller 3 provided in an image forming apparatus main body to thereby transfer the toner image formed on the photosensitive drum 10 to a recording medium 4. Thereafter, any residual toner on the photosensitive drum 10 is removed by the cleaning means 14. The cleaning means 14 scrapes off the toner residual on the photosensitive drum 10 by an elastic cleaning blade 14*a* provided in abutting relationship with the photosensitive drum 10 and collects it into the waste toner container 12.

Figure 20:
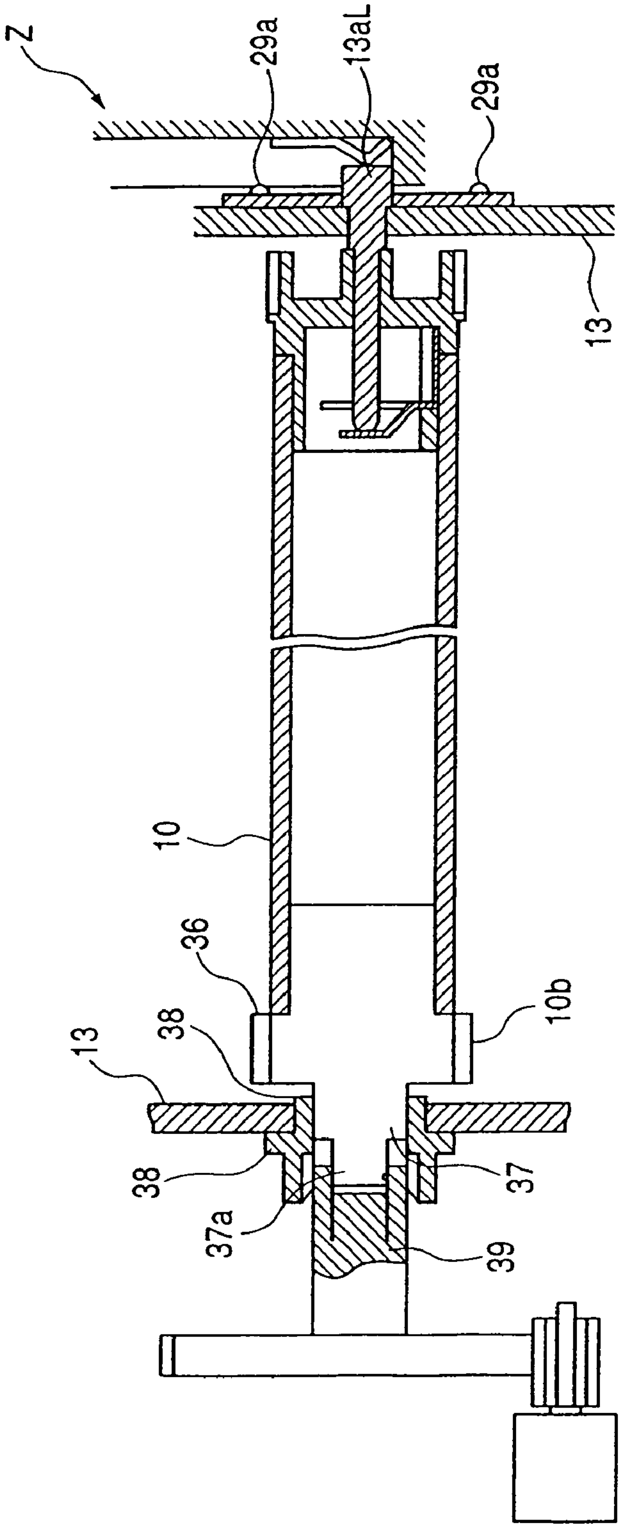
FIG. 20 is a cross-sectional view of the photosensitive member unit of the process cartridge to be disassembled by the disassembling tool according to the present invention.
Figure 21:
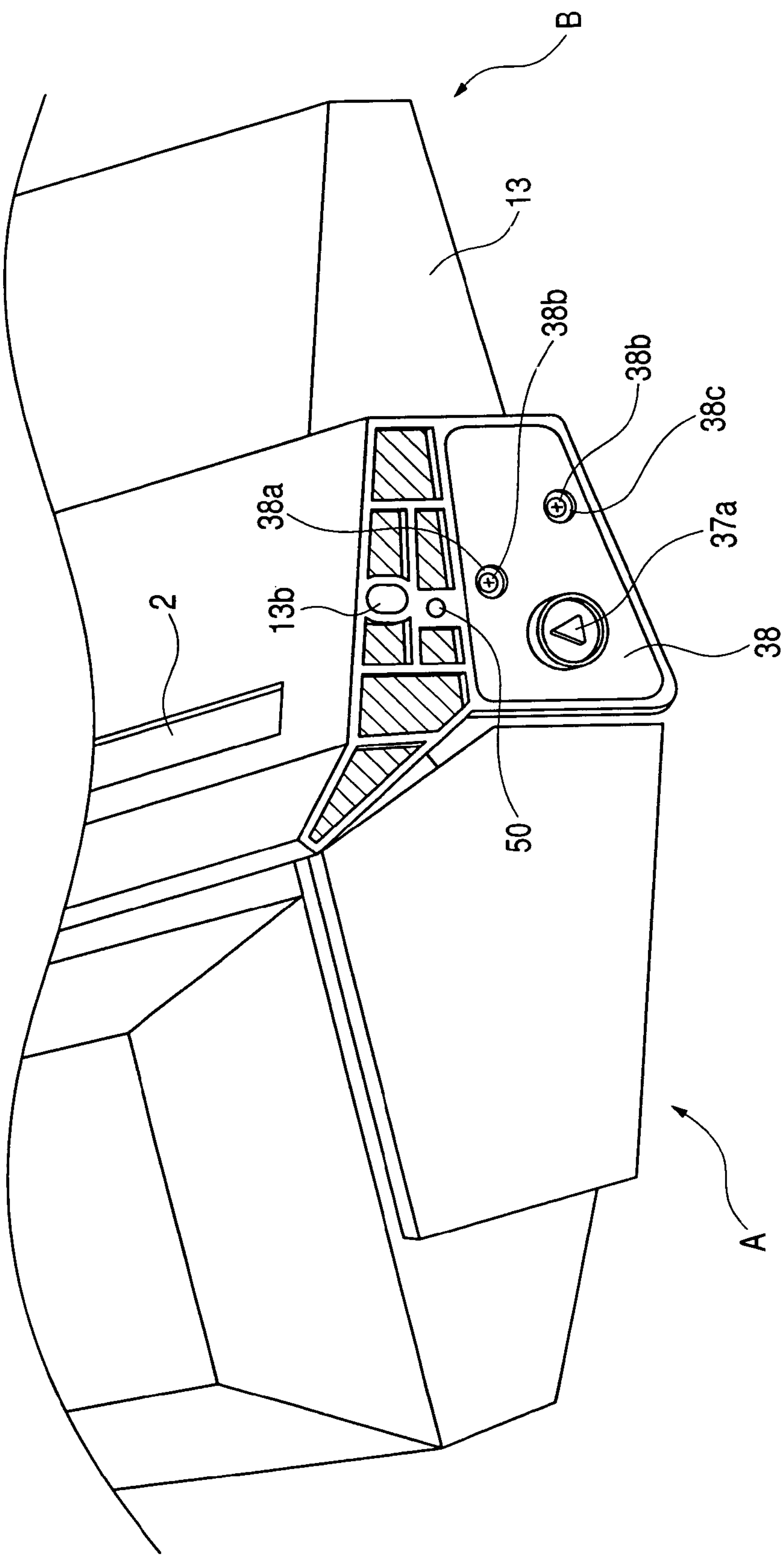
FIG. 21 is a side view of the process cartridge to be disassembled by the disassembling tool according to the present invention.

Also, as shown in FIG. 20, a drum flange 36 is an integrally molded article having a drum gear 10*b*, a convex shaft 37 and a convex portion 37*a*, and is a driving force transmitting part having the function of transmitting a driving force. A concave portion 39 is provided on the image forming apparatus side to transmit the driving force to the convex portion 37*a*. A bearing 38 is of a concave shape in order to receive the concave portion 39 and to effect the positioning of the cartridge P when mounted on the image forming apparatus main body. FIG. 21 shows the fixing of the bearing 38 to the cleaning frame body 13, and there are formed concave portions 38*a* and 38*c*, in which screws 38*b* are inserted and fixed.

Figure 22A:
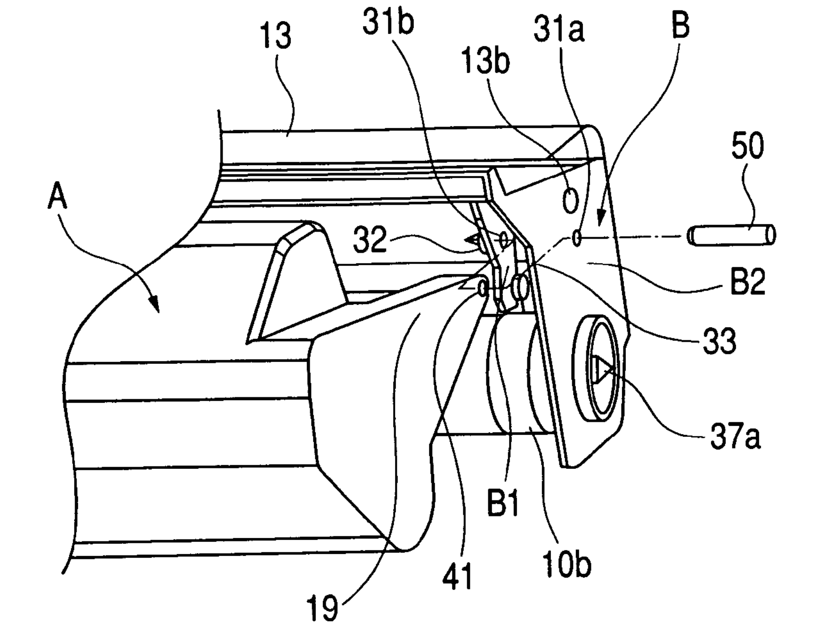
FIG. 22A is a perspective view showing the frame body coupling portion of the process cartridge to be disassembled by the disassembling tool according to the present invention.
Figure 22B:
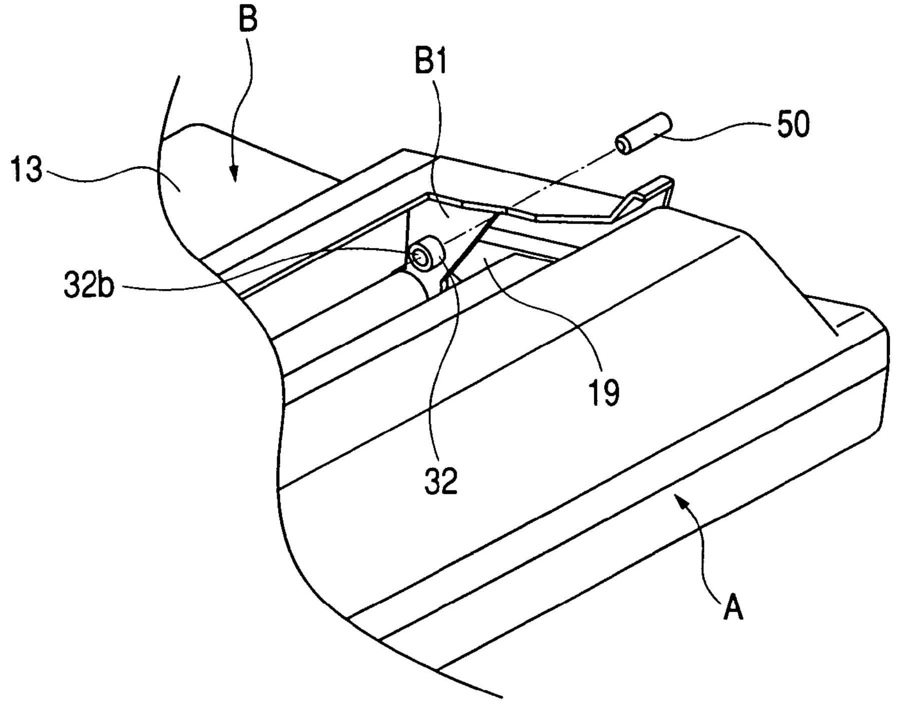
FIG. 22B is a perspective view showing the frame body coupling portion of the process cartridge to be disassembled by the disassembling tool according to the present invention.

FIGS. 22A and 22B show the coupling of the developing device unit A and the photosensitive member unit B.

The developing device unit A and the photosensitive member unit B are pivotally coupled together by a coupling pin 50 having a circular cross section to thereby constitute the cartridge P. That is, as shown in FIG. 22A, circular pivot apertures 41 are formed parallel to the developing roller 20 at the tip ends of arm portions 19 formed on the opposite sides of a developing frame body 15 in the lengthwise direction thereof (the axial direction of the developing roller 20). On the other hand, concave portions 33 for inserting the arm portions 19 thereinto are provided at two locations on the opposite sides of the cleaning frame body 13 in the lengthwise direction thereof. The arm portions 19 are inserted into these concave portions 33, and the coupling pin 50 is forced into the outer supporting hole 31*a* of the cleaning frame body 13. The coupling pin 50 is then fitted into the pivot aperture 41 at the end of the arm portion 19 and is further forced into an inner supporting hole 31*b* and is attached thereto, whereby the developing device unit A and the photosensitive member unit B are coupled together for pivotal movement about the coupling pin 50.

Figure 23:
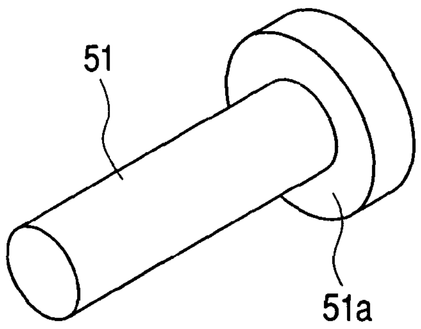
FIG. 23 is a perspective view of a pin used for the frame body coupling of the process cartridge to be disassembled by the disassembling tool according to the present invention.

A mounting portion for the coupling pin 50 will now be described in detail. The arm portions 19 of the developing device unit A are inserted into the concave portions 33 between the inner side plate B1 and the outer side plate B2 of the photosensitive member unit B. Positioning is effected so that the outer supporting hole 31*a*, the inner supporting hole 31*b* and the pivot apertures 41 may be disposed substantially coaxially with one another. Thereafter, the coupling pin 50 is forced in from the outside of the outer side plate B2 of the photosensitive member unit B. The outer diameter portion of the coupling pin 50, the outer supporting hole 31*a* and the inner supporting hole 31*b* are in a tight fit relationship with one another, and the outer diameter portion of the coupling pin 50 and the pivot apertures 41 are in a loose fit relationship with each other. Consequently, after the coupling pin 50 has been forced in, the developing device unit A is supported for pivotal movement about the coupling pin 50, while on the other hand, the coupling pin 50 is restrained in the photosensitive member unit B with strength to withstand a predetermined or greater pull-out load. An aperture portion 32 of a bag aperture shape is provided around the inner supporting hole 31*b* to enhance the holding force of the coupling pin 50 and prevent the slipping-out of the pin and the fall of the shavings of the frame body during the insertion thereof. The coupling pin 50 has its rear end portion inserted thereafter to the position of the bag hole bottom 32*b* of the aperture portion 32. Also, the coupling pin 50 may be such a pin having a level difference in the diametral direction thereof as shown in FIG. 23.

The coupling of the developing device unit A and the photosensitive member unit B on the lengthwisely opposite side is done in a similar manner.

First Embodiment

First Disassembling Tool

Figure 1:
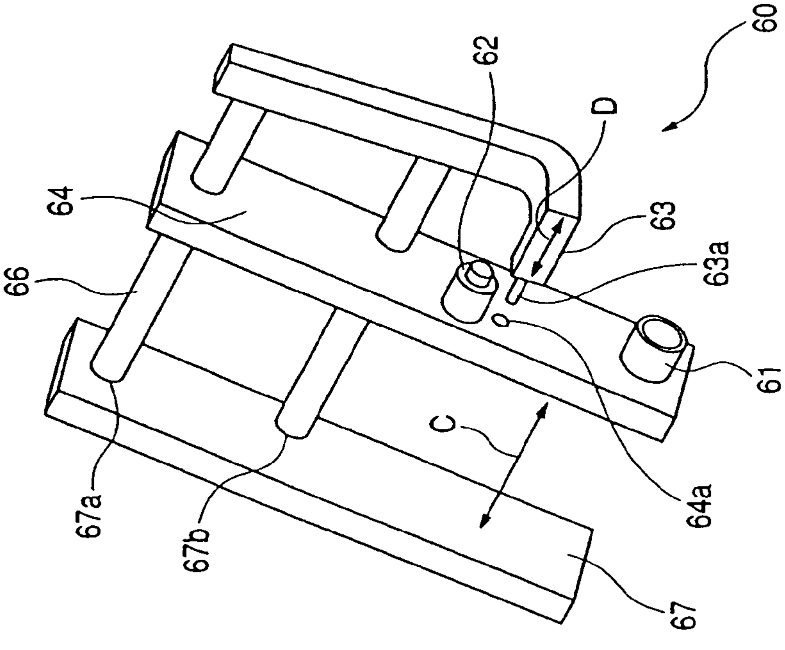
FIG. 1 is a perspective view of a disassembling tool according to a first embodiment of the present invention.

A first disassembling tool 60 shown in FIG. 1 is such that a first positioning portion 61 and a second positioning portion 62 are provided on a first plate 64 which is a supporting portion or base body.

A pushing-out portion 63 is fixed to two connecting bars 66 parallel to each other. Further, the connecting bars 66 extend through the first plate 64 and are fixed to a second plate 67 at fixing portions 67*a* and 67*b*. The fixing may be effected by forming holes in the second plate 67 and fitting the connecting bars into the holes, or may be effected by the use of screws.

As described above, the connecting bars 66 extend through the first plate 64 and are fixed to the pushing-out portion 63 and the second plate 67 and therefore, the first plate 64 becomes slidable in the direction of arrow C between the second plate 67 and the pushing-out portion 63. Therefore, the pushing-out portion 63 becomes slidable in the direction of arrow D relative to the first positioning portion 61 and the second positioning portion 62 provided on the first plate 64.

Also, the first positioning portion 61 is of a concave shape so as to be positioned on a convex portion 37*a* provided on one end of the photosensitive drum 10 shown in FIG. 21, and is made of resin so as not to injure or bruise the convex portion 37*a* during positioning. Also, the second positioning portion 62 is of a convex shape so as to be engaged with and positioned by a slot 13*b* formed in the cleaning frame body 13. Thereby the mounting angle of the first disassembling tool 60 onto the cleaning frame body 13 is determined.

While in the foregoing, the positioning of the first positioning portion 61 is done relative to the convex portion 37*a* of the photosensitive drum 10, it may be done anywhere if the first positioning portion 61 can be fixed to the frame, and may be done relative to a bearing 38, as shown in FIG. 21. Also, the positioning may be done by the heads of screws 38*b*, or may be done by concave portions 38*a* and 38*c*. Also, the second positioning portion 62 may be provided at any location at which the angle of the disassembling tool is determined, and may be provided at a blank portion E between ribs. That is, it may be provided at any location on the outer surface of the cartridge P at which the disassembling tool 60 can be easily positioned.

While in the foregoing, the first positioning portion is of a concave shape and the second positioning portion is of a convex shape, it is also possible to select a concave shape or a convex shape in conformity with the shape of the locations at which they are positioned.

A pushing-out pin 63*a* is provided on the pushing-out portion 63 in a direction facing the aforedescribed first positioning portion and second positioning portion. The diameter r1 of the tip end of the pushing-out pin 63*a* is in the relation that r1.ltoreq.r2 relative to the diameter r2 of the coupling pin 50. Also, a pin discharging port 64*a* for discharging the pushed-out coupling pin 50 out of the cartridge P may be provided at a location on the first plate

64 which faces the pin 50 (this will be described later in detail in a disassembling method which will be described later).

The pushing-out portion 63 is inserted into the interior of the cartridge P from an exposure opening portion 2 provided in the cleaning frame body 13 of the cartridge P shown in FIG. 21, and reaches the location of the coupling pin 50.

Second Disassembling Tool

Figure 2:
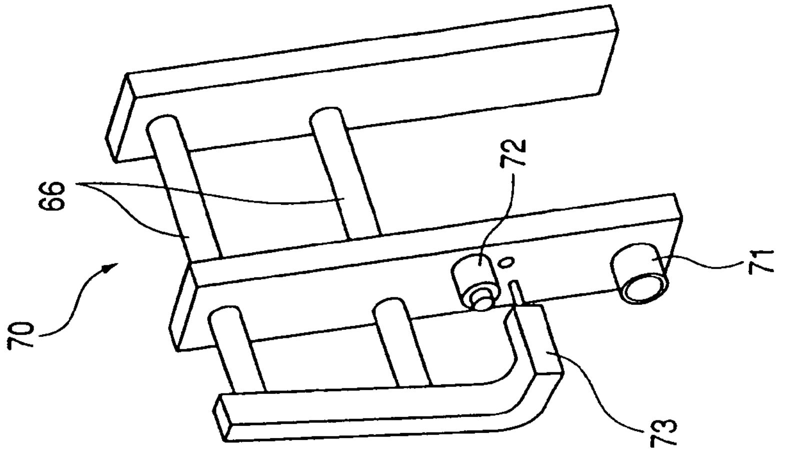
FIG. 2 is a perspective view of the disassembling tool according to the first embodiment of the present invention.

The first disassembling tool 60 is a tool for pushing out the coupling pin 50 on the convex portion 37*a* side (FIG. 21) of the photosensitive drum 10, whereas a second disassembling tool 70 shown in FIG. 2 is a tool for pushing out the coupling pin 50 provided on the lengthwisely opposite side. The same portions as those of the aforedescribed first disassembling tool 50 need not be described.

Figure 19:
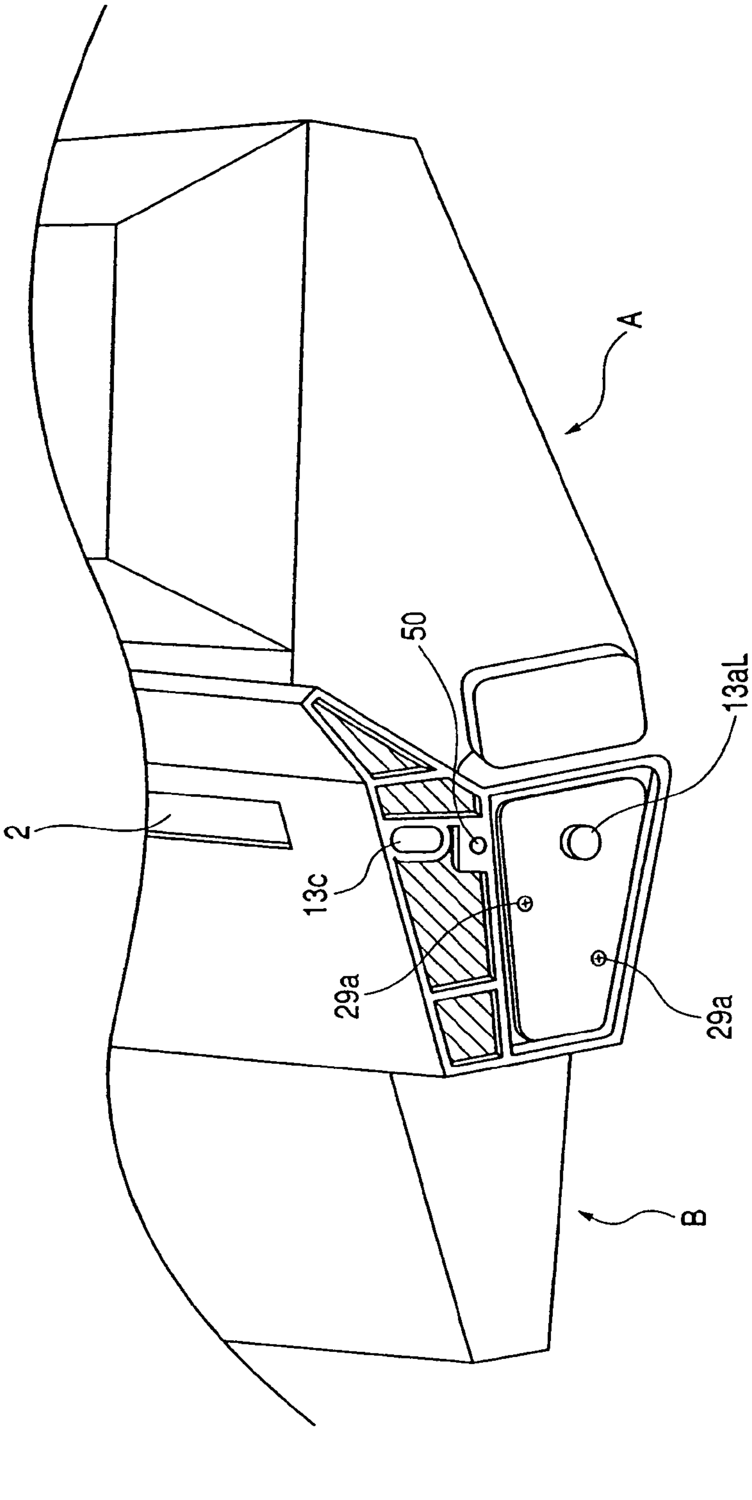
FIG. 19 is a side view of the process cartridge to be disassembled by the disassembling tool according to the present invention.

As shown in FIGS. 19 and 20, a cylindrical guide 13*a*L for rotatably supporting the photosensitive drum 10 on the cleaning frame body 13 and supporting the process cartridge on the image forming apparatus, and for effecting the grounding of the photosensitive drum 10 is provided on the other end of the photosensitive drum 10.

A first positioning portion 71 of the second disassembling tool 70 is of a concave shape so as to be positioned on the cylindrical guide 13*a*L. Also, a second positioning portion 72 is engaged with and positioned by a slot 13*c* (see FIG. 19) formed in the cleaning frame body 13. Thereby the mounting angle of the second disassembling tool 70 onto the cleaning frame body 13 is determined.

While in the foregoing, the positioning of the first positioning portion 71 is done relative to the cylindrical guide 13*a*L, the first positioning portion 71 may be positioned anywhere if it can be fixed to the frame, and the positioning thereof may be done by screws 29*a*, as shown in FIG. 19. Also, the second positioning portion 72 may be provided at any location at which the angle of the disassembling tool is determined, and may be provided in a blank portion F between ribs.

While in the foregoing, the first positioning portion is of a concave shape and the second positioning portion is of a convex shape, it is also possible to select a concave shape or a convex shape in conformity with the shape of the locations at which they are positioned.

A description will now be provided of a method of disassembling the cartridge P by the use of the above-described first disassembling tool 60 and second disassembling tool 70.

Disassembling Method

FIGS. 3A, 3B to FIGS. 6A and 6B are perspective views and cross-sectional views showing the manner in which the cartridge P is disassembled by the use of the first disassembling tool 60 and the second disassembling tool 70.

When the cartridge P is to be disassembled, use is first made of the first disassembling tool 60 (FIGS. 3A, 3B, 4A and 4B). The cleaning frame body 13 is provided with the exposure opening portion 2 for applying therethrough a laser beam from the optical system 1 provided in the image forming apparatus L to the photosensitive drum 10.

Figure 3B:
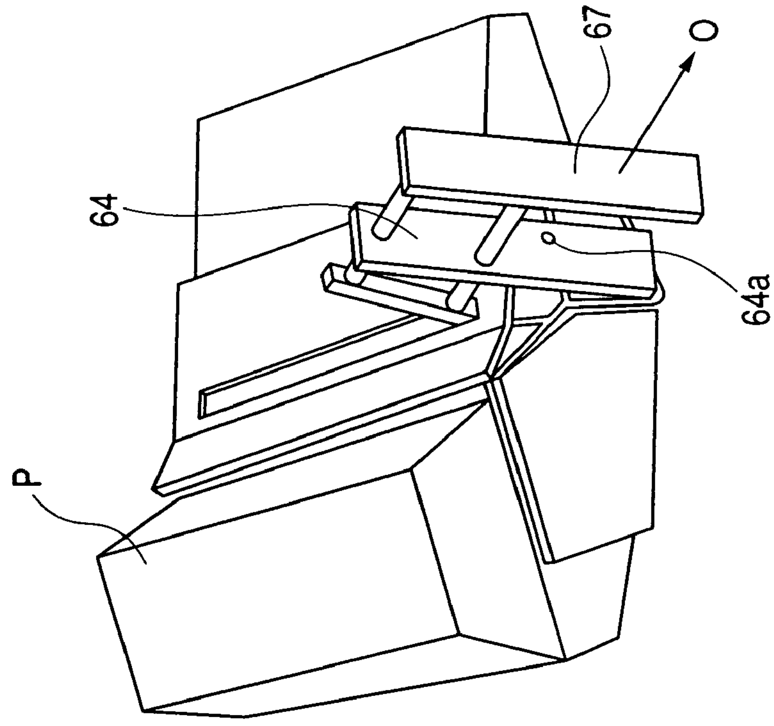
FIGS. 3A and 3B are perspective views showing a method of disassembling a process cartridge according to the first embodiment of the present invention.
Figure 3A:
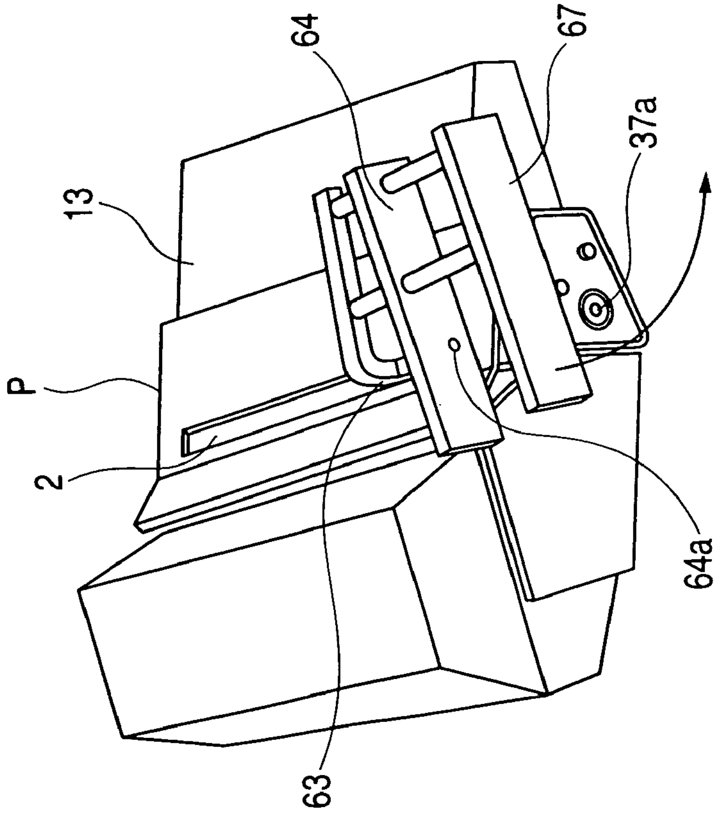
Figure 4B:
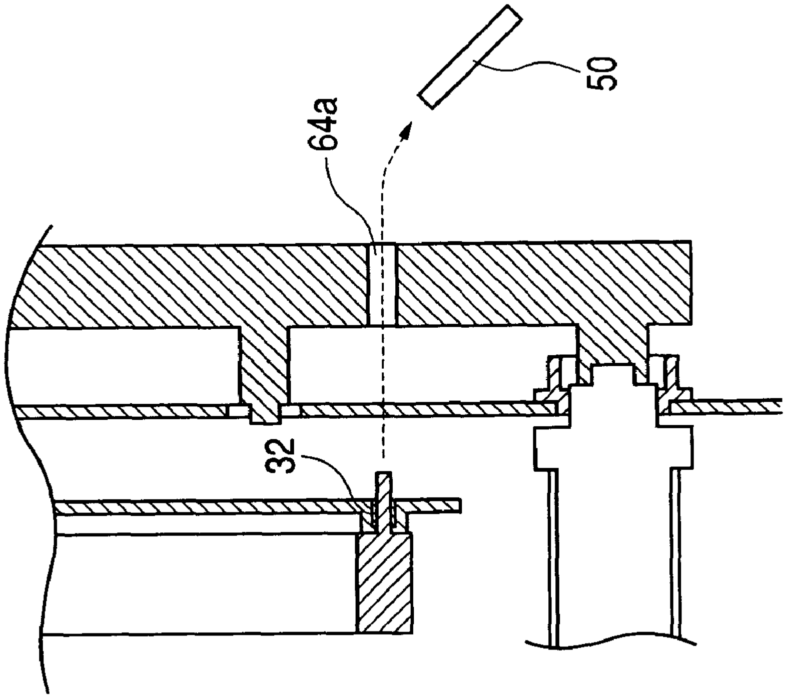
FIGS. 4A and 4B are cross-sectional views showing the method of disassembling the process cartridge according to the first embodiment of the present invention.
Figure 4A:
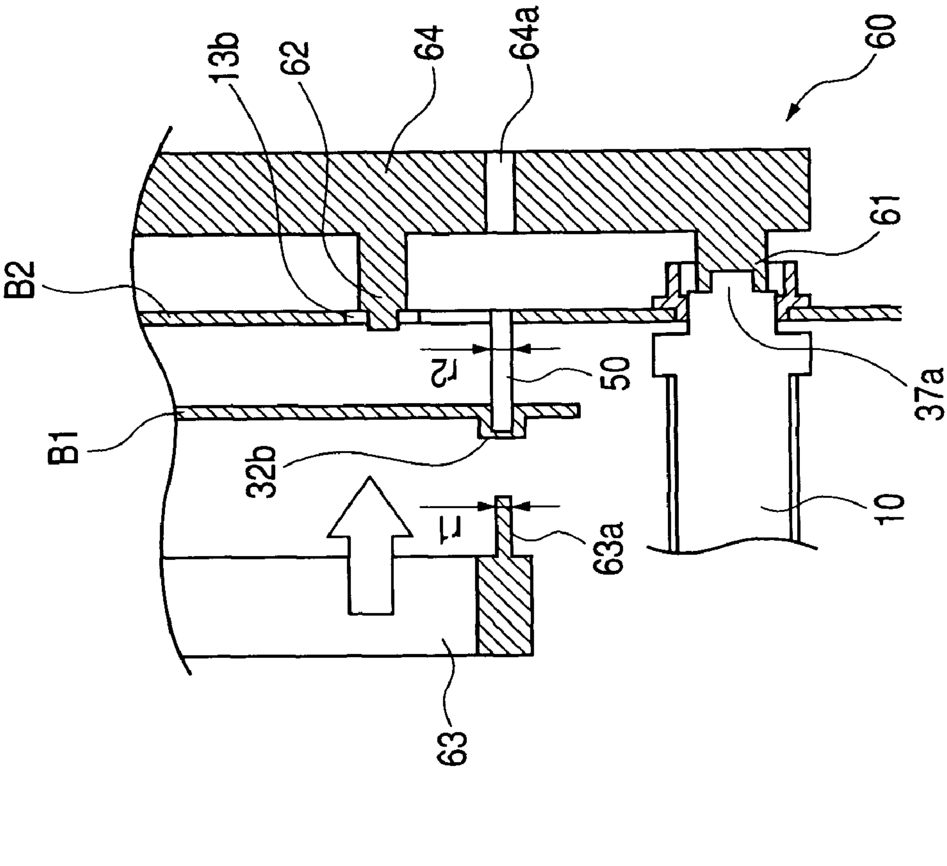

The pushing-out portion 63 is inserted into the interior of the cartridge through the exposure opening portion 2 by rotating the tool 60 (FIG. 3A). Thereafter, the first positioning portion 61 is positioned by a convex portion 37*a* provided on one end of the photosensitive drum 10 and the second positioning portion is fitted into a slot 13*b* formed in the cleaning frame body 13 (FIGS. 3B and 4A). Thereafter, the second plate 67 is slid in the direction of arrow G while the first plate 64 is held down by a hand (FIGS. 3B and 4B). Then, the pushing-out portion 63 destroys the bag hole bottom 32*b* provided in the cleaning frame body 13 and pushes the coupling pin 50 out of the cartridge P through the pin discharging port 64*a* formed in the first plate 64 (FIG. 4B). In this case, the diameter r1 of the tip end of the pushing-out pin 63*a* of the pushing-out portion 63 is in the relation that $r1<r2$ relative to the diameter r2 of the coupling pin 50 and therefore, after the pushing-out portion 63 has destroyed the bag hole bottom 32*b*, it can push the coupling pin 50 out of the cartridge P. Consequently, it never happens that the diameter of the hole 32 with which the coupling pin is engaged is enlarged. That is, it never happens that the coupling pin 50 comes off when it is again inserted during reproduction.

Figure 24:
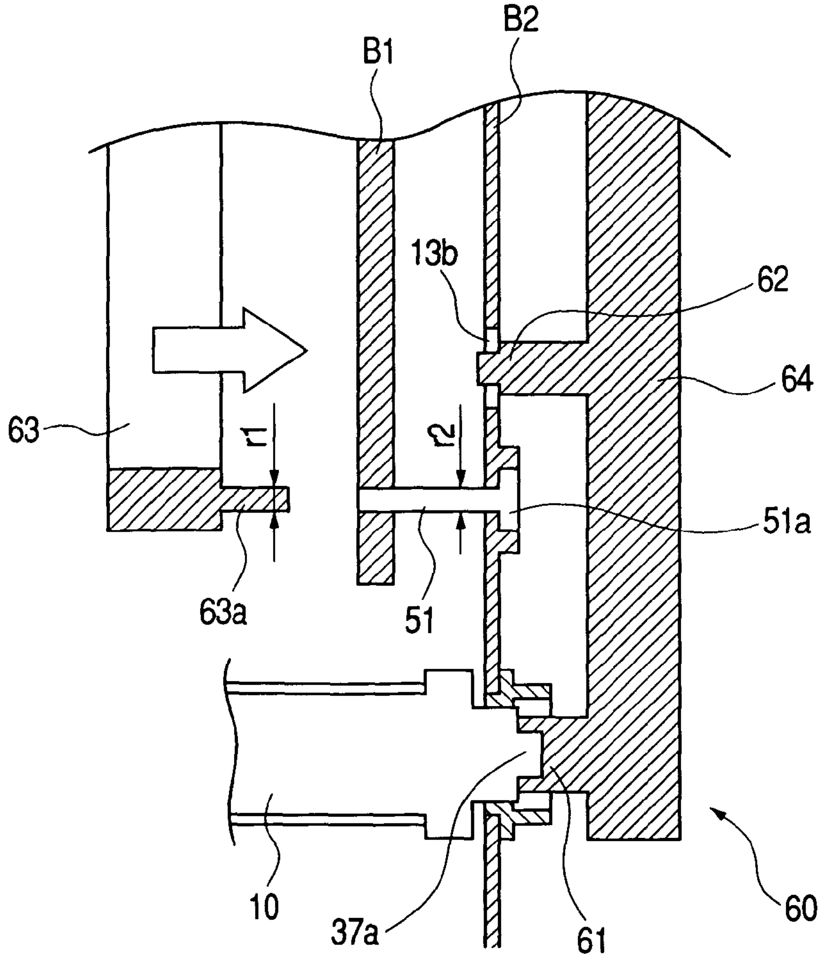
FIG. 24 is a cross-sectional view showing the method of disassembling the process cartridge by the disassembling tool according to the present invention.

Also, when as shown in FIGS. 23 and 24, in case that the pin is a coupling pin 51 having a level difference in the diametral direction thereof, a bag hole shape need not be provided in the outer side plate B2 of the photosensitive member unit. That is, the coupling pin 51 is positioned on the outer side plate B2 of the photosensitive member unit by the level difference portion 51*a* and therefore, it never happens that the coupling pin 51 comes off relative to the direction of insertion. Accordingly, the level difference portion 51*a* strikes against the outer side plate B2 of the photosensitive member unit when the coupling pin 51 is inserted again and therefore, it never happens that the coupling pin 51 comes down into the cartridge P.

Figure 25B:
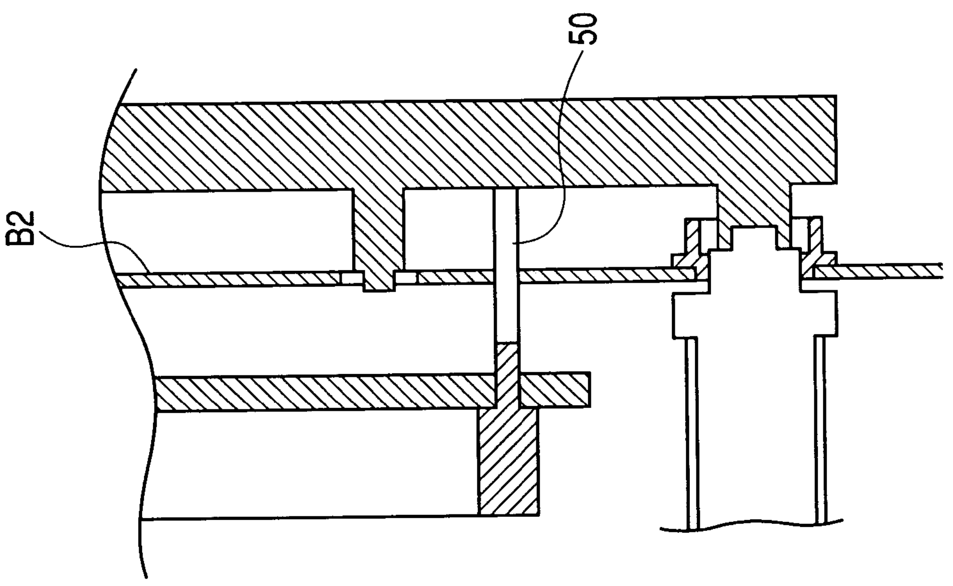
FIGS. 25A and 25B are cross-sectional views showing the method of disassembling the process cartridge by the disassembling tool according to the present invention.
Figure 25A:
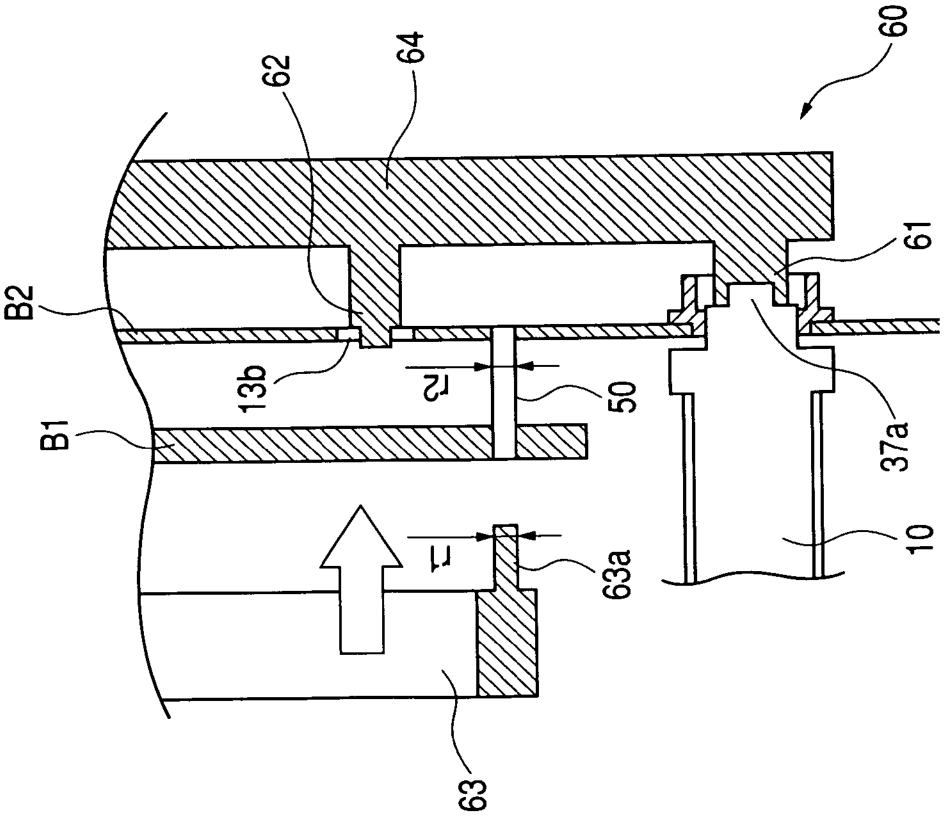

Also, in the above-described embodiment, the pin discharging port 64*a* is provided to take out the coupling pin 50 when the coupling pin 50 is pushed out by the pushing-out portion 63. However, if as shown in FIGS. 25A and 25B, the tip end of the coupling pin 50 which has been pushed out is brought outwardly of the outer side plate B2 of the photosensitive member unit and it is pulled out by a hand, the pin discharging port 64*a* need not be provided.

Subsequently, the coupling pin 50 in the lengthwisely opposite direction is likewise taken out by the use of the second disassembling tool 70 (FIGS. 5A, 5B, 6A and 6B).

Figure 5B:
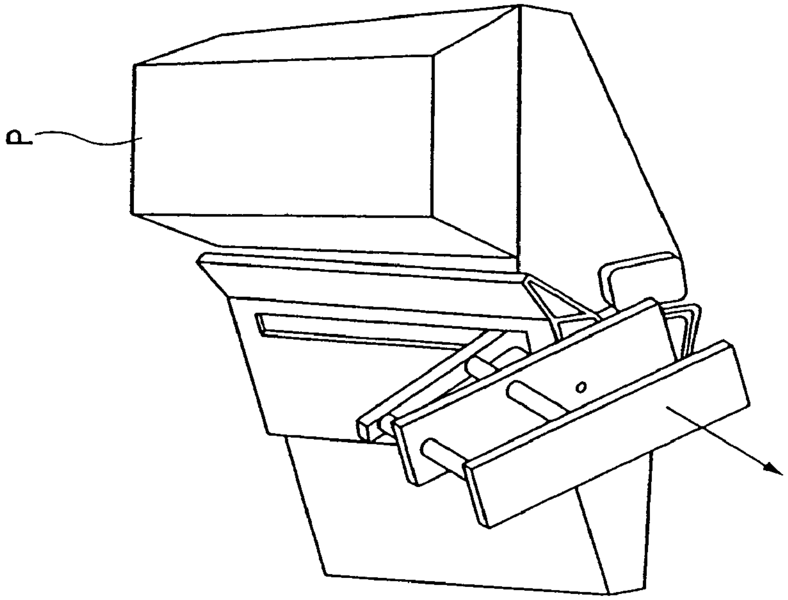
FIGS. 5A and 5B are perspective views showing the method of disassembling the process cartridge according to the first embodiment of the present invention.
Figure 5A:
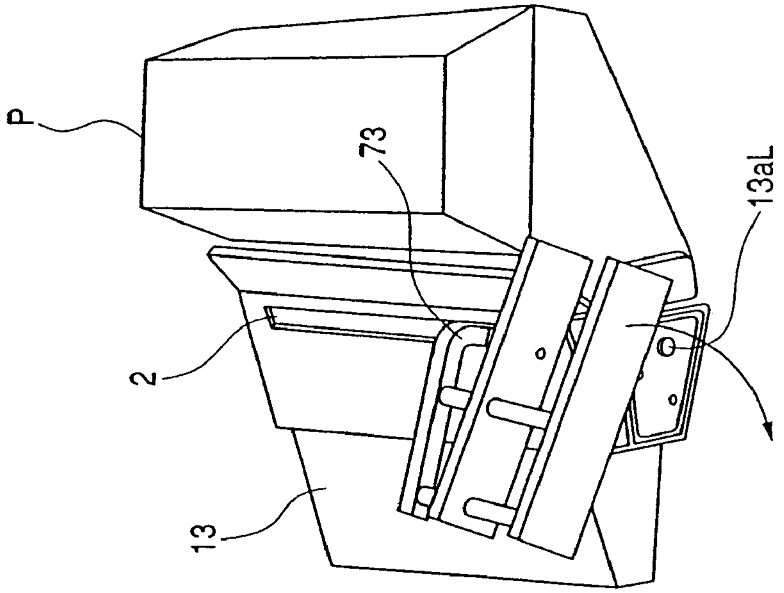
Figure 6B:
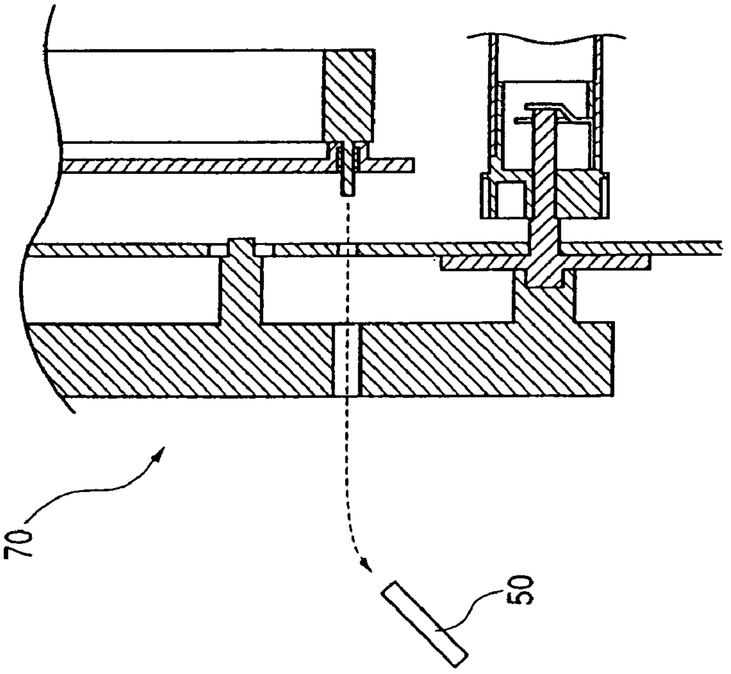
FIGS. 6A and 6B are cross-sectional views showing the method of disassembling the process cartridge according to the first embodiment of the present invention.
Figure 6A:
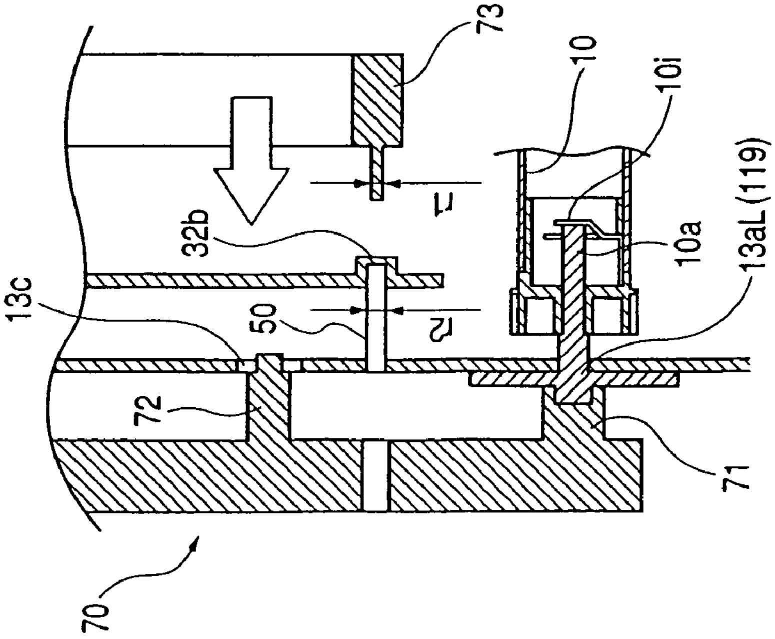

The pushing-out portion 73 is inserted through the exposure opening portion 2 while the tool is rotated (FIG. 5A). Thereafter, the first positioning portion 71 is positioned by the cylindrical guide 13*a*L provided on the other end of the photosensitive drum 10 the second positioning portion 72 is fitted in the slot 13*c* formed in the cleaning frame body 13 (FIGS. 5B and 6A). Thereafter, as in the case of the above-described first disassembling tool 60, the coupling pin 50 is pushed out of the cartridge P (FIG. 6B).

Second Embodiment

Figure 7B:
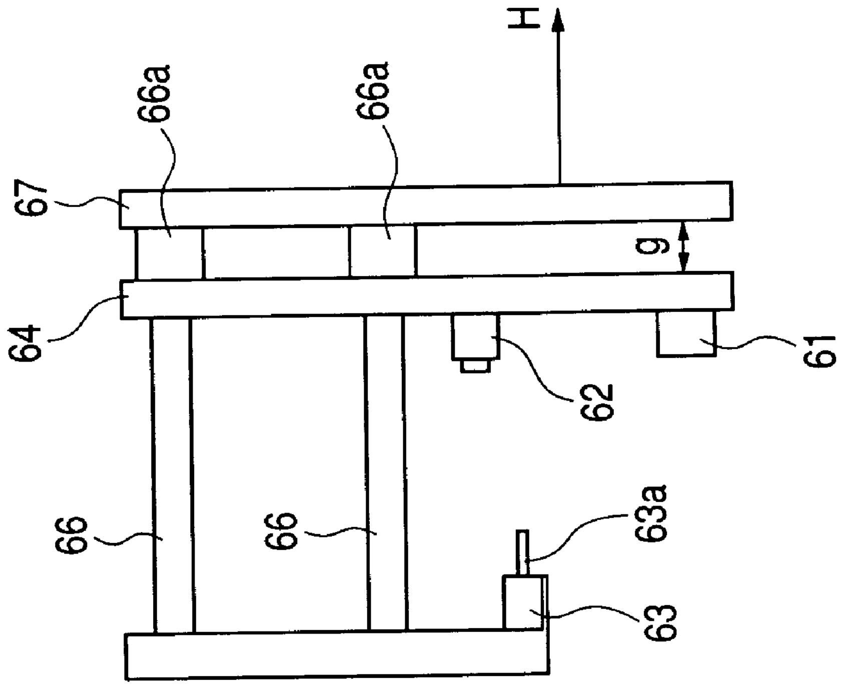
FIG. 7B is a front view of the disassembling tool according to the second embodiment of the present invention.
Figure 7A:
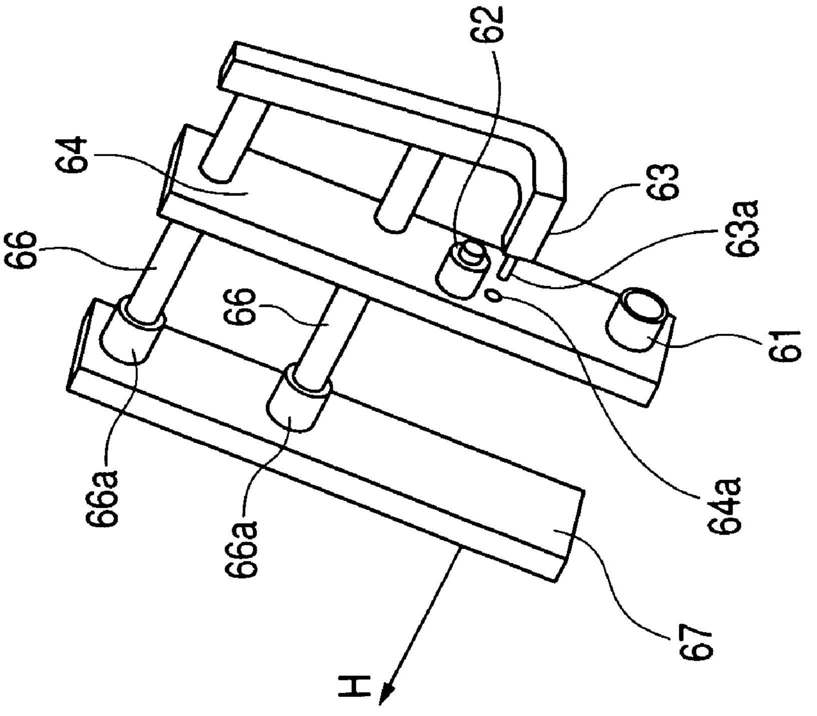
FIG. 7A is a perspective view of a disassembling tool according to a second embodiment of the present invention.

As shown in FIGS. 7A and 7B, level difference portions 66*a* larger in diameter than the through-holes of the first plate 64 are provided on the connecting bars 66 of the first disassembling tool 60 adjacent to the second plate 67. When the above-described construction is adopted, a prescribed interval g is maintained between the first plate 64 and the second plate 67. Therefore, after positioning has been effected by the first positioning portion 61 and the second positioning portion 62, when the second plate 67 is slid in the direction of arrow H while the first plate 64 is held down by a hand, it is possible to put the fingers into the interval g, and the second plate 67 can be gripped easily. It is possible to adopt a similar construction also in the second disassembling tool 70.

Third Embodiment

Figure 8:
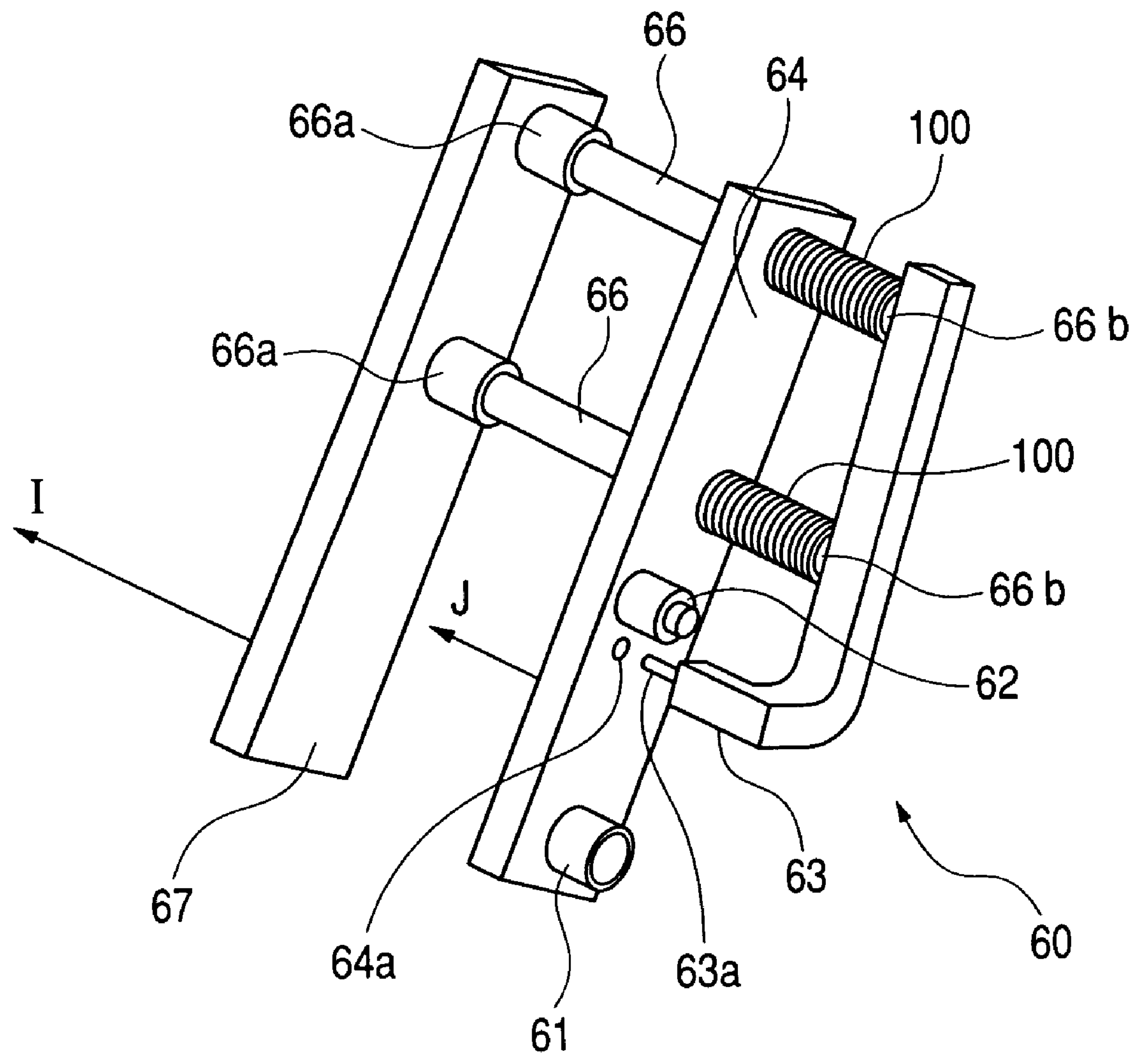
FIG. 8 is a perspective view of a disassembling tool according to a third embodiment of the present invention.
Figure 9B:
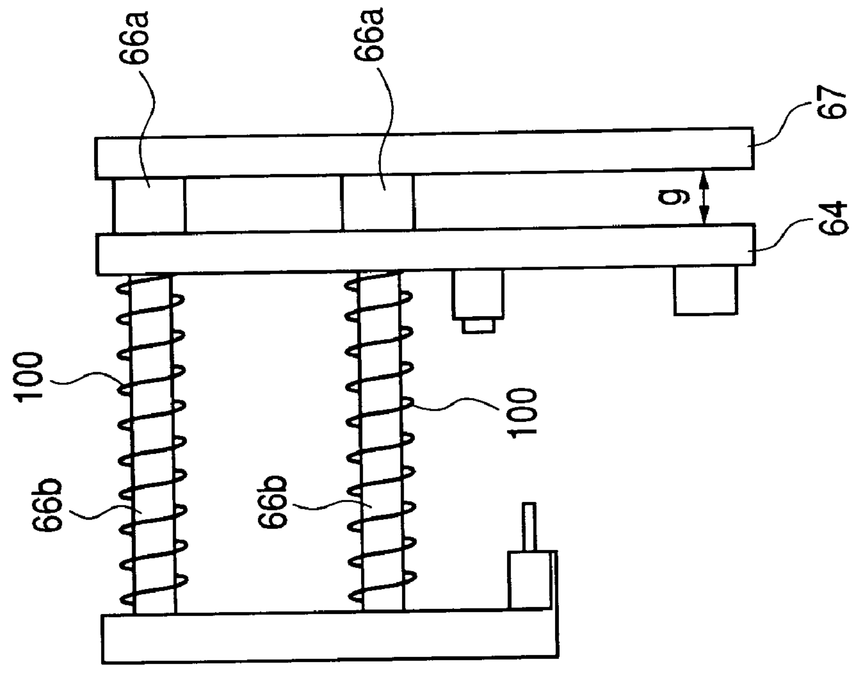
FIG. 9B is a front view of the disassembling tool according to the third embodiment of the present invention.
Figure 9A:
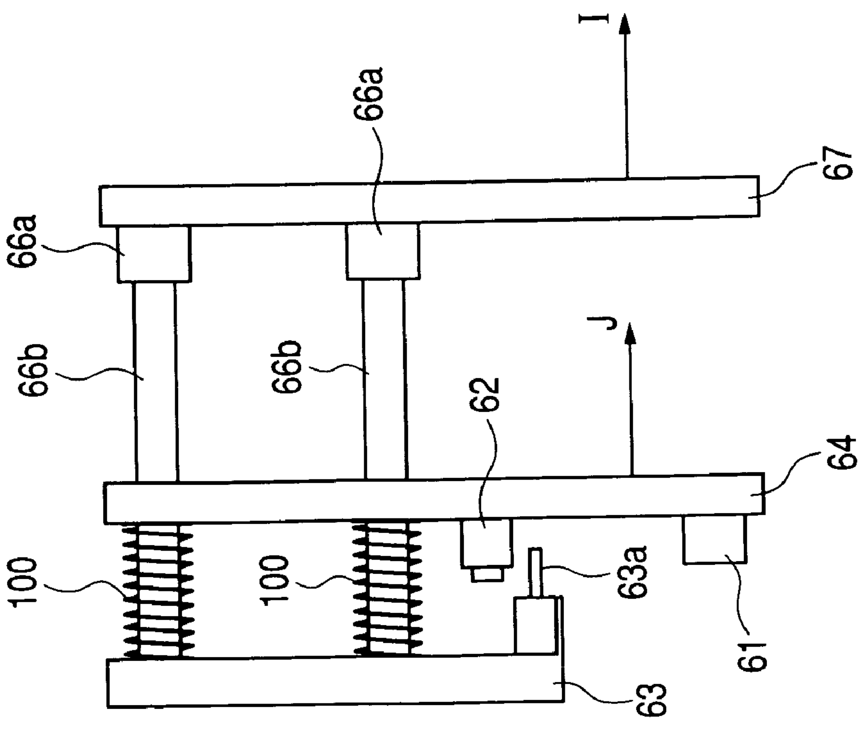
FIG. 9A is a front view of the disassembling tool according to the third embodiment of the present invention.

As shown in FIGS. 8, 9A and 9B, level difference portions 66*a* larger in diameter than the through-holes of the first plate 64 are provided on the connecting bars 66 of the first disassembling tool 60 adjacent to the second plate 67. Further, biasing means 100 are provided on the small-diametered portions 66*b* of the connecting bars 66 between the first plate 64 and the pushing-out portion 63. The biasing means 100 are formed by compression coil springs or the like to bias the first plate 64 and the pushing-out portion 63 away from each other. By the above-described construction, the second plate 67 is slid in the direction of arrow I and the coupling pin 50 is pushed out, whereafter the first plate 64 is biased in the direction of arrow J by the biasing means 100 and is returned to the level difference portions 66*a* (FIG. 9B). Thus, when the first disassembling tool 60 is used next time, the prescribed interval g is maintained from the first, and the work of returning the first plate 64 to the level difference portions 66*a* can be omitted. It is possible to adopt a similar construction also in the second disassembling tool 70.

Fourth Embodiment

Figure 10:
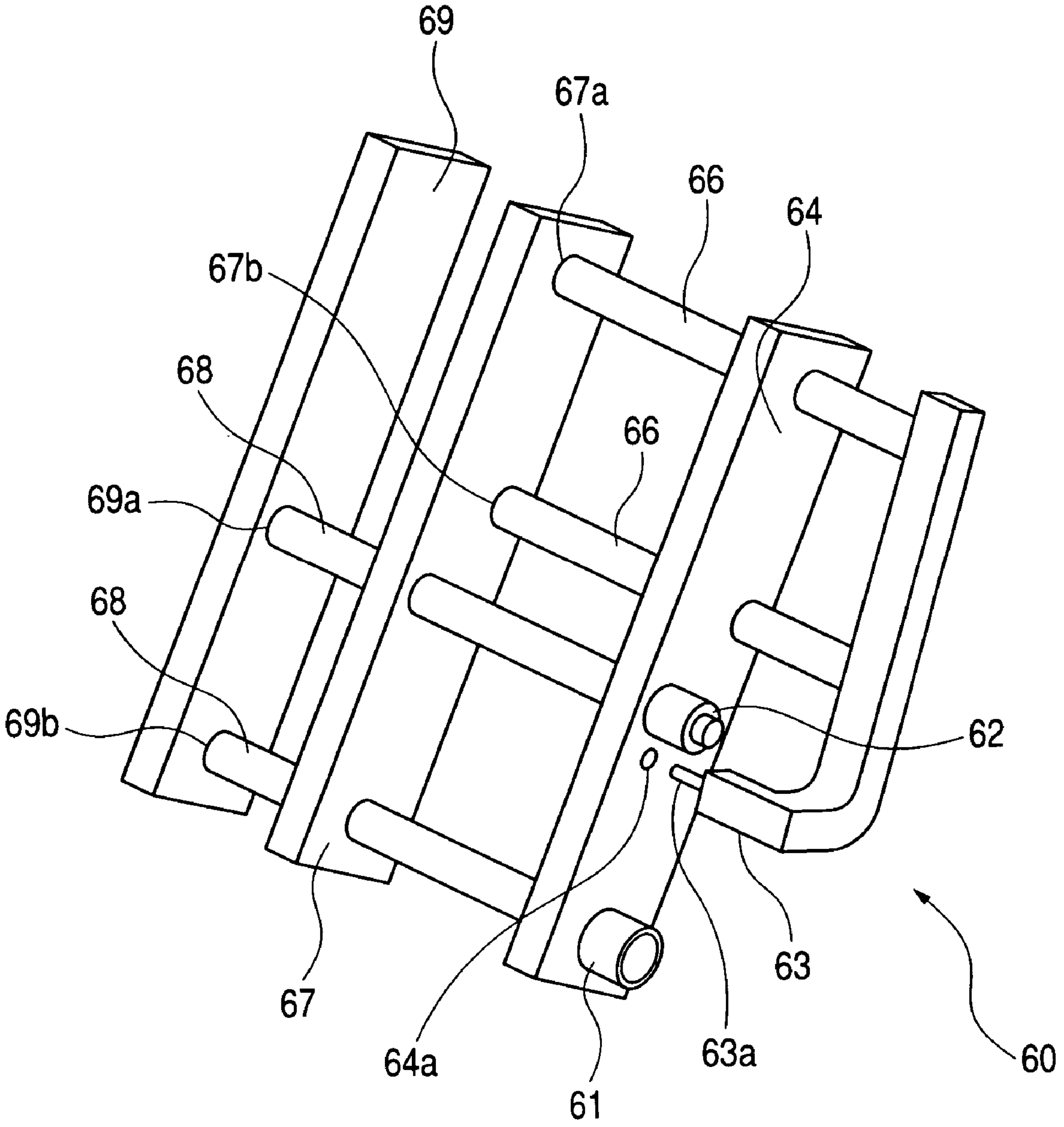
FIG. 10 is a perspective view of a disassembling tool according to a fourth embodiment of the present invention.
Figure 11A:
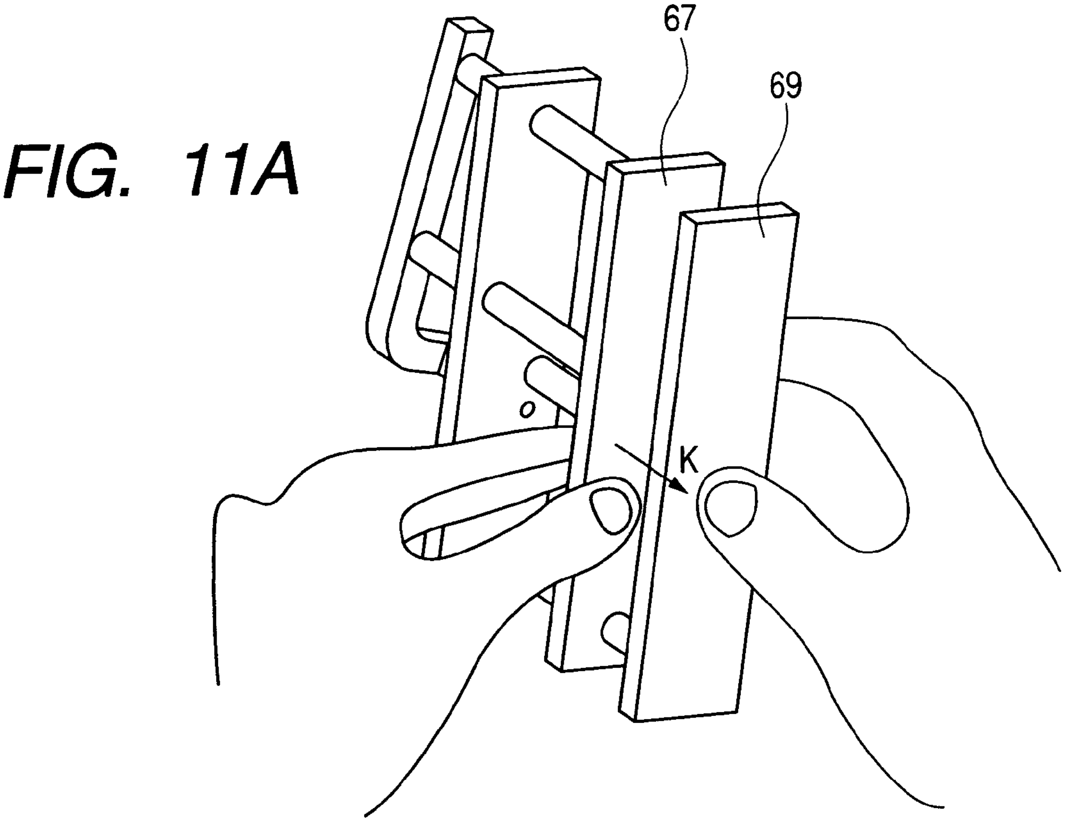
FIG. 11A is a perspective view showing the way of holding the disassembling tool according to the fourth embodiment of the present invention.
Figure 11B:
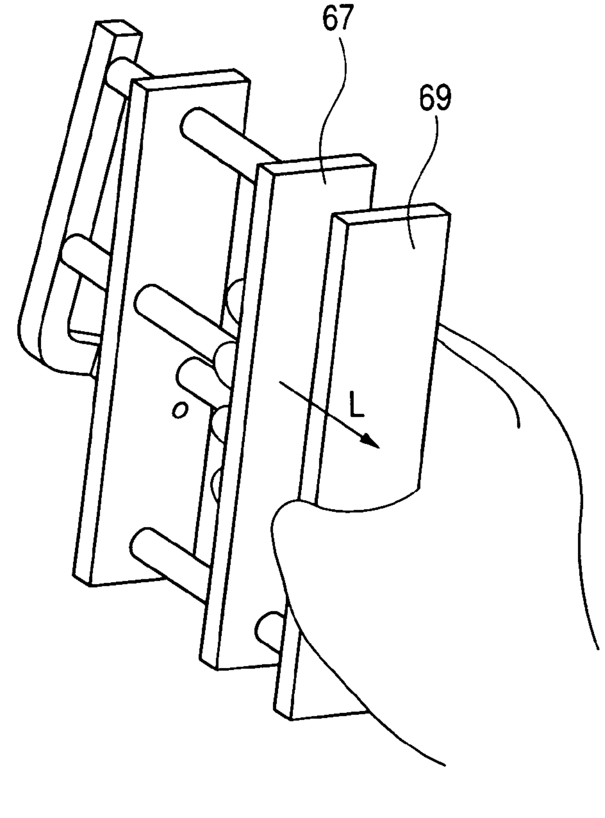
FIG. 11B is a perspective view showing the way of holding the disassembling tool according to the fourth embodiment of the present invention.

As shown in FIG. 10, two connecting bars 68 parallel to each other are fixed onto the first plate 64 of the first disassembling tool 60. The connecting bars 68 extend through the second plate 67 and are fixed to a third plate 69 by fixing portions 69*a* and 69*b*. By adopting the above-described construction, the second plate 67 and the third plate 69 provide grip portions when disassembly is effected. That is, as shown in FIG. 11A, the third plate 69 can be held by one hand and the second plate 67 can be slid in the direction of arrow K by the other hand to thereby push out the coupling pin 50. Alternatively, as shown in FIG. 11B, the third plate 69 can be held by the thumb and the palm and the second plate 67 can be slid in the direction of arrow L by the other fingers than the thumb. The above-described construction is also possible in the second disassembling tool 70.

Fifth Embodiment

Figure 12:
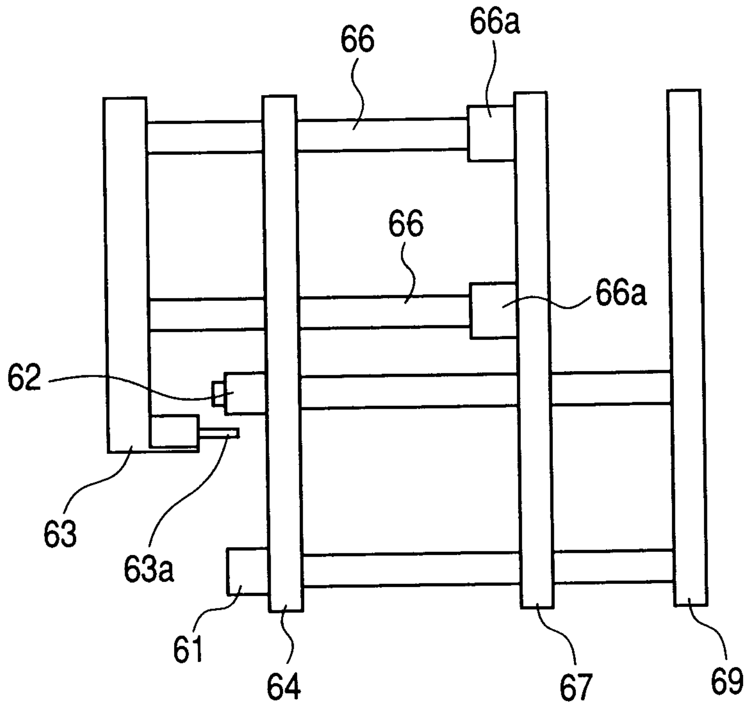
FIG. 12 is a front view of a disassembling tool according to a fifth embodiment of the present invention.
Figure 13:
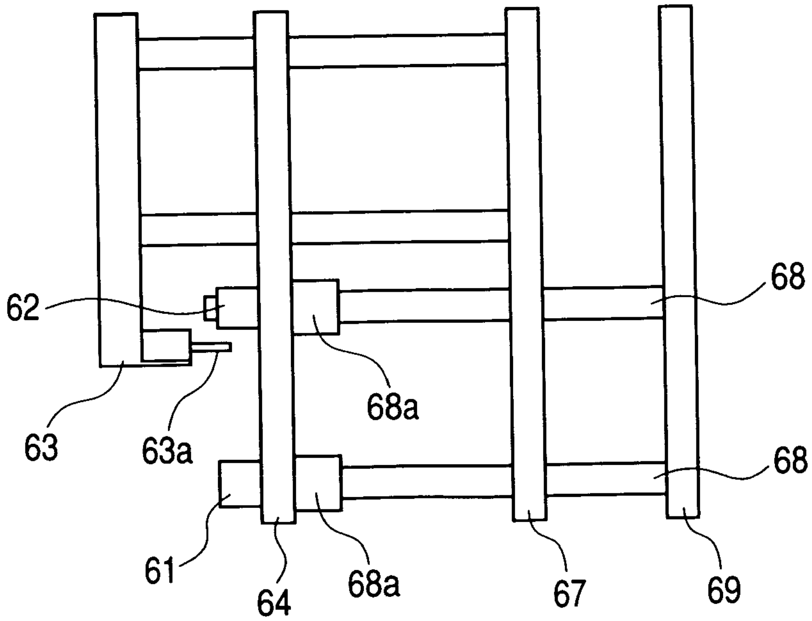
FIG. 13 is a front view of the disassembling tool according to the fifth embodiment of the present invention.

In the disassembling tool shown in the fourth embodiment, it is also possible to adopt the construction shown in the second embodiment. That is, as shown in FIG. 12, level difference portions 66*a* larger in diameter than the through-holes of the first plate 64 may be provided on the connecting bars 66 adjacent to the second plate 67. Also, as shown in FIG. 13, level difference portions 68*a* larger in diameter than the through-holes of the second plate 67 may be provided on connecting bars 68 adjacent to the first plate 64. The above-described constructions are also possible in the second disassembling tool 70.

Sixth Embodiment

Figure 14:
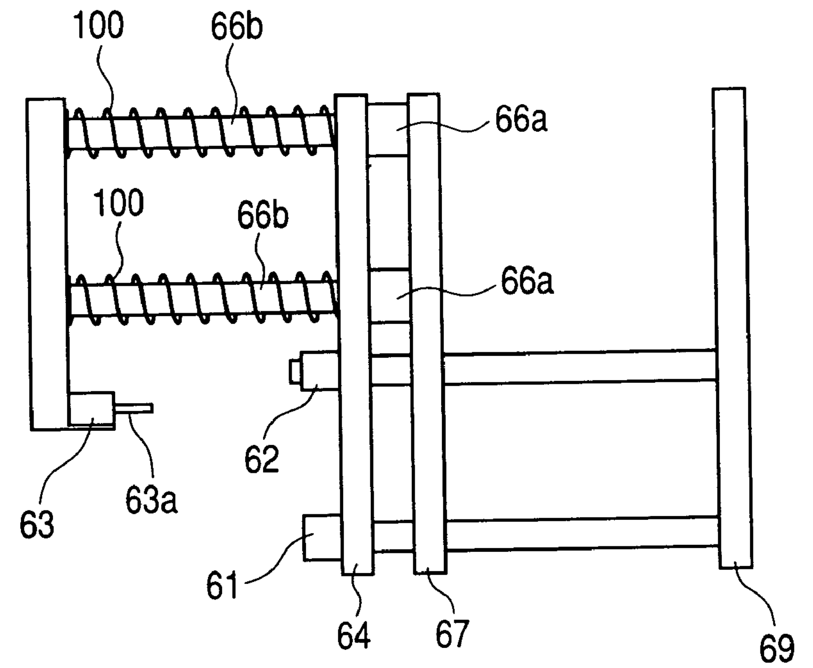
FIG. 14 is a front view of a disassembling tool according to a sixth embodiment of the present invention.
Figure 15:
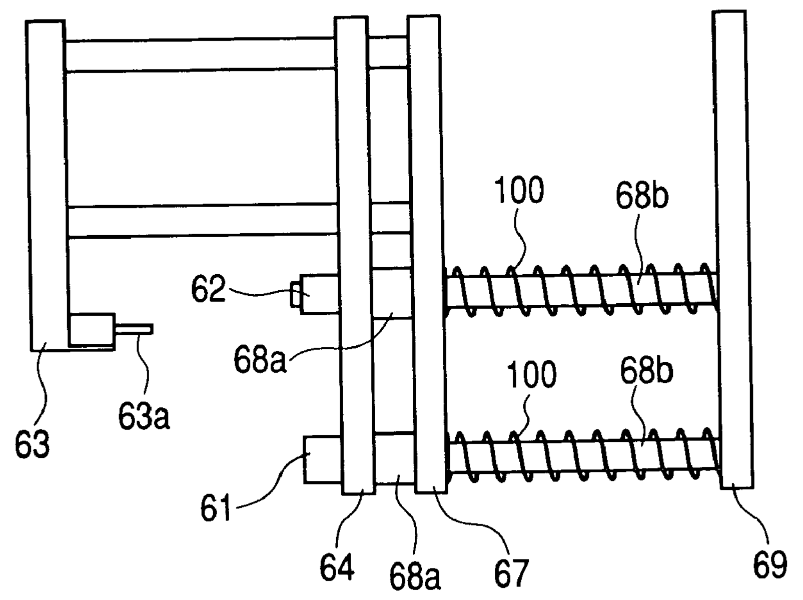
FIG. 15 is a front view of the disassembling tool according to the sixth embodiment of the present invention.
Figure 16:
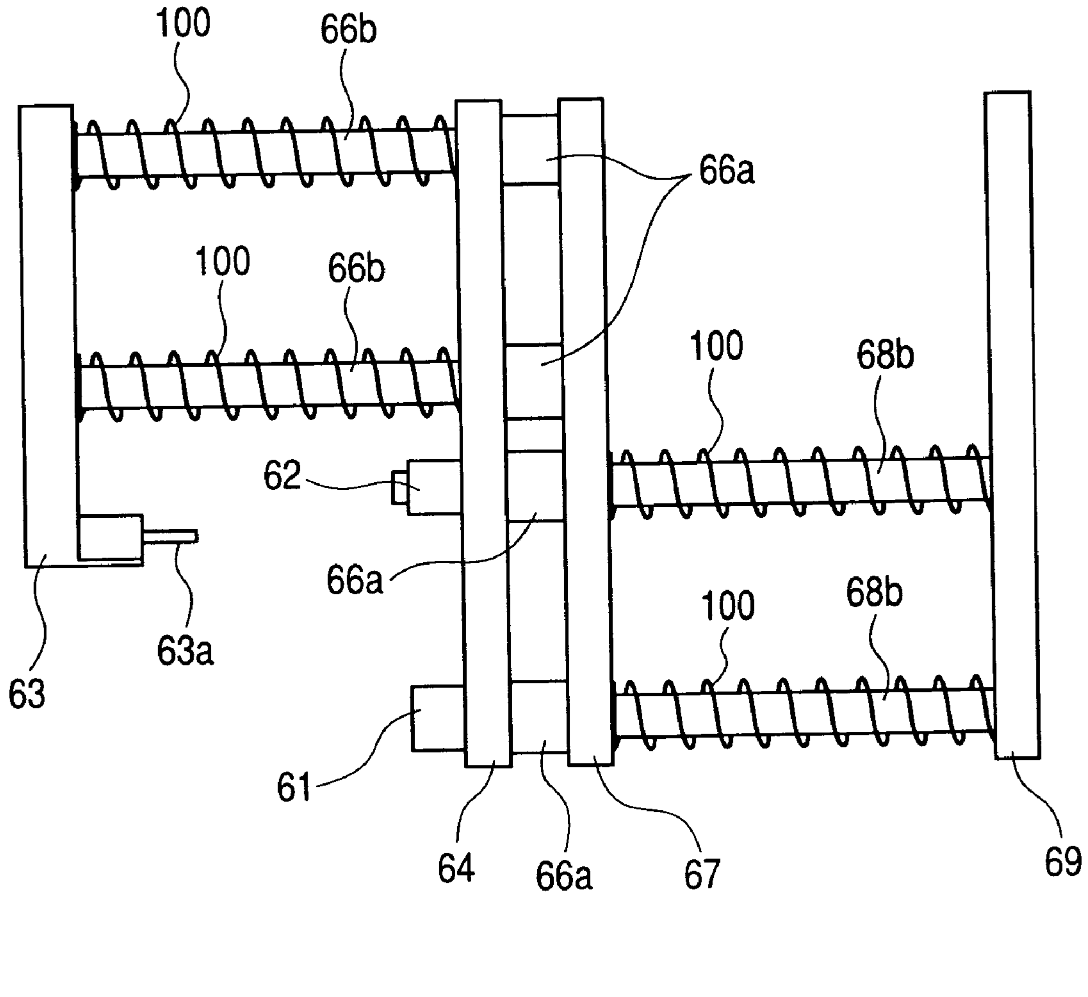
FIG. 16 is a front view of the disassembling tool according to the sixth embodiment of the present invention.

In the disassembling tool shown in the fifth embodiment, it is also possible to adopt the construction shown in the third embodiment. That is, as shown in FIG. 14, urging means 100 may be provided on the small-diametered portions 66*b* of the connecting bars 66 between the pushing-out portion 63 and the first plate 64. Also, as shown in FIG. 15, biasing means 100 may be provided on the small-diametered portions 68*b* of the connecting bars 68 between the second plate 67 and the third plate 69. Also, as shown in FIG. 16, the urging means 100 may be provided on both of the connecting bars 66 and 68. The above-described constructions are also possible in the second disassembling tool 70.

Seventh Embodiment

Third Disassembling Tool

Figure 17B:
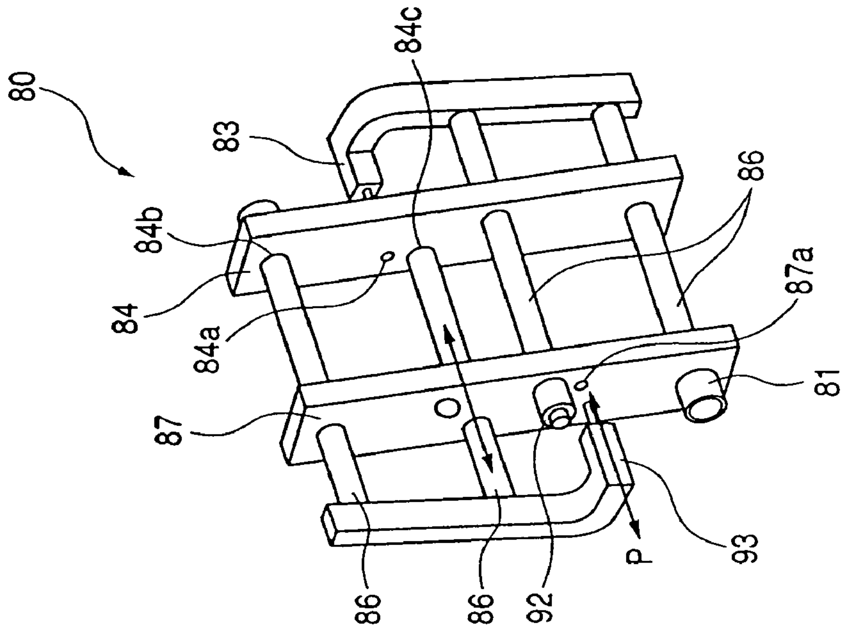
FIG. 17B is a perspective view of the disassembling tool according to the seventh embodiment of the present invention.
Figure 17A:
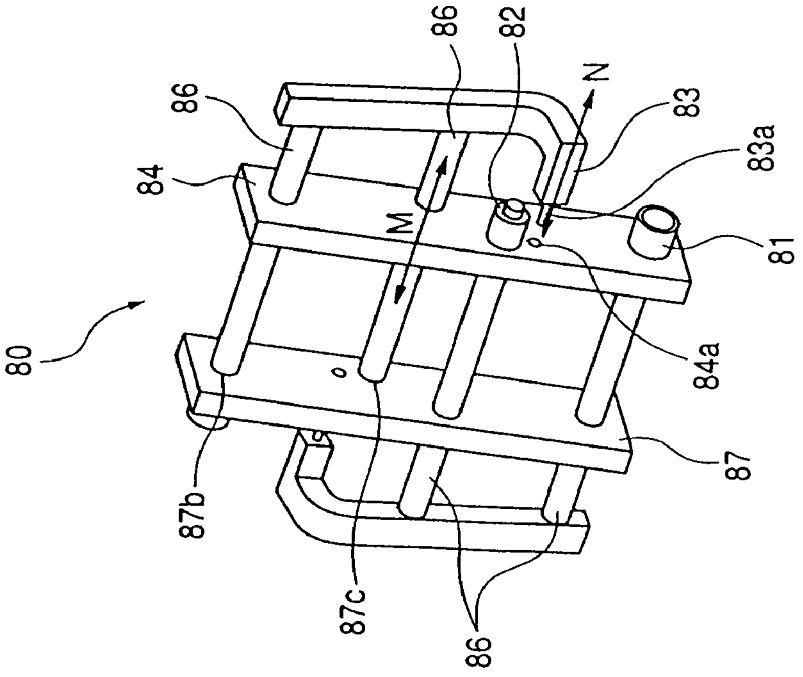
FIG. 17A is a perspective view of a disassembling tool according to a seventh embodiment of the present invention.

FIGS. 17A and 17B show a third disassembling tool 80. A first positioning portion 81 and a second positioning portion 82 are provided on a first plate 84, which comprises a first base body. A first pushing-out portion 83 is fixed to two connecting bars 86 parallel to each other, and the connecting bars 86 extend through the first plate 84 and are fixed to a second plate 87, which comprises a second base body, by fixing portions 87*b* and 87*c*. A first positioning portion [[91]] (unillustrated) and a second positioning portion 92 are provided on the opposite surfaces of the fixing portions 87*b* and 87*c* on the second plate 87. A second pushing-out portion 93 is fixed to two connecting bars [[88]] parallel to each other, and the connecting bars [[88]] extend through the second plate 87 and are fixed to the first plate 84 by fixing portions 84*b* and 84*c*.

As described above, the connecting bars 86 extend through the first plate 84 and are fixed to the first pushing-out portion 83 and the second plate 87. Consequently, the first plate 84 becomes slidable in the direction of arrow M between the second plate 87 and the first pushing-out portion 83. Therefore, the first pushing-out portion 83 becomes slidable in the direction of arrow N relative to the first positioning portion 81 and the second positioning portion 82 provided on the first plate 84.

Also, the connecting bars [[88]] extend through the second plate 87 and are fixed to the second pushing-out portion 93 and the first plate 84. Consequently, the second plate 87 becomes slidable in the direction of arrow O between the first plate 84 and the second pushing-out portion 93. Therefore, the second pushing-out portion 93 becomes slidable in the direction of arrow P relative to the first positioning portion [[91]] and the second positioning portion 92 provided on the second plate 87.

The first positioning portion 81 is of a concave shape so as to be positioned on the convex portion 37*a* provided on one end of the photosensitive drum 10 shown in FIG. 21. The first positioning portion 81 is made of resin so as not to injure or bruise the convex portion 37*a*. Also, the second positioning portion 82 is of a convex shape so as to be positioned relative to the slot 13*b* formed in the cleaning frame body 13. The second positioning portion 82 determines the mounting angle of the third disassembling tool 80 onto the cleaning frame body 13.

While in the foregoing, the positioning of the first positioning portion 81 is effected relative to the convex portion 37*a* of the photosensitive drum 10, it may be done anywhere if the first positioning portion 81 can be fixed to the frame, and as shown in FIG. 21, the positioning may be effected relative to the bearing 38. Also, the positioning may be effected by the heads of the screws 38*b*, or may be effected by the concave portions 38*a* and 38*c*. Also, the second positioning portion may be provided at any location at which the angle of the disassembling tool is determined, and may be provided in the blank portion E between ribs.

A pushing-out pin 83*a* is provided on the first pushing-out portion 83 in a direction facing the aforedescribed first positioning portion and second positioning portion, and the diameter r1 of the tip end thereof is in the relation that $r1 \leqq r2$ relative to the diameter r2 of the coupling pin 50. Also, a pin discharging port 84*a* for discharging the pushed-out coupling pin 50 out of the cartridge P may be provided at a location on the first plate 84 which faces the pin 50.

The first positioning portion [[91]] on the second plate 87 is of a concave shape so as to be positioned on the cylindrical guide 13aL shown in FIGS. 19 and 20. Also, the second positioning portion 92 is positioned relative to the slot 13c formed in the cleaning frame body 13, and determines the mounting angle of the third disassembling tool 80 onto the cleaning frame 13.

While in the foregoing, the positioning of the first positioning portion [[91]] on the second plate 87 is effected relative to the cylindrical guide 13aL, the positioning may be done anywhere if the first positioning portion [[91]] on the second plate 87 can be fixed, and may be effected by the screws 29a, as shown in FIG. 19. Also, the second positioning portion 92 may be provided at any location at which the angle of the disassembling tool is determined, and may be provided in a blank portion F between ribs.

While in the foregoing, the first positioning portion is of a concave shape and the second positioning portion is of a convex shape, it is also possible to select a concave shape or a convex shape in conformity with the shapes of the locations at which they are positioned. It is also possible for the third disassembling tool shown above to adopt the constructions shown in the fifth embodiment and the sixth embodiment. That is, the connecting bars can be provided with level difference portions, and an interval into which fingers can be put can be provided between the plates. Also, biasing means can be provided on the small-diametered portions of the connecting bars, whereby after the coupling pin has been pulled out, the plate can be returned to the level difference portions by the biasing means to thereby always maintain a prescribed minimum interval.

A description will now be provided of a method of disassembling the cartridge P by the use of the above-described third disassembling tool 80.

Disassembling Method

This disassembling method is carried out in a manner similar to the disassembling methods using the afore-described first disassembling tool 60 and second disassembling tool 70. The first pushing-out portion 83 is inserted into the interior of the cartridge through the exposure opening portion 2 provided in the cleaning frame body 13 by rotating the tool. Thereafter, the first positioning portion 81 and the second positioning portion 82 are positioned by the convex portion 37a provided on one end of the photosensitive drum 10 being fitted into the slot 13b formed in the cleaning frame body 13. Thereafter, the second plate 87 is slid, whereby the pushing-out portion 83 destroys the bag hole bottom 32b provided in the cleaning frame body 13. The coupling pin 50 is pushed out of the cartridge P through the pin discharging port 84a provided in the first plate 84. Subsequently, the second pushing-out portion 93 is inserted into the interior of the cartridge through the exposure opening portion 2 in the lengthwisely opposite side of the cartridge while the tool is rotated.

Thereafter, the first positioning portion [[91]] on the second plate 87 and the second positioning portion 92 are positioned by the cylindrical guide 13aL provided on the other end of the photosensitive drum 10 being fitted into the slot 13c formed in the cleaning frame body 13. Thereafter, in the same manner as described above, the coupling pin 50 is pushed out of the cartridge P. Also, while in the above-described embodiments, the pin discharging ports 84a and 87a are provided, the pin discharging ports 84a and 87a need not be provided if as shown in FIGS. 25A and 25B, the tip end of the pushed-out coupling pin 50 is put outside the outer side plate B2 of the photosensitive member unit and it is pulled out by a hand.

As has been described above, according to the present invention, the disassembling tool can be easily positioned relative to the process cartridge, and a coupling member for rotatably coupling a first frame and a second frame together can be reliably removed, and a process cartridge having the first frame and the second frame can be disassembled easily.

What is claimed is:

1. A disassembling tool for pushing a coupling member out of a process cartridge detachably attachable to an image forming apparatus main body, the process cartridge having an electrophotographic photosensitive member, process means for acting on the electrophotographic photosensitive member, a first frame, a second frame and the coupling member for rotatably coupling the first frame and the second frame together, said disassembling tool having:
- a base body;
- an engagement portion provided on said base body and adapted to be engaged with the process cartridge to thereby position the process cartridge when said disassembling tool is mounted on the process cartridge;
- a pushing-out portion provided for movement relative to said base body and configured and positioned to push out the coupling member; and
- a grip portion configured and positioned to be gripped when said pushing-out portion is to be moved, and connected to said pushing-out portion,
- said engagement portion being provided at a location opposed to said pushing-out portion in a movement direction in which said pushing-out portion is moved.

2. The disassembling tool according to claim 1, further comprising a connecting bar connecting said pushing-out portion and said grip portion.

3. The disassembling tool according to claim 2, wherein said connecting bar has a level difference portion configured and positioned to contact said base body to thereby form a gap between said grip portion and said base body when said pushing-out portion is moved in a direction to push out the coupling member.

4. The disassembling tool according to claim 1, wherein said engagement portion is engaged with a side of the process cartridge in a lengthwise direction of a photosensitive drum comprising the electrophotographic photosensitive member.

5. The disassembling tool according to claim 1, wherein said engagement portion is positionable at the center of a photosensitive drum, wherein the photosensitive drum comprises the electrophotographic photosensitive member.

6. The disassembling tool according to claim 1, wherein the pushing-out portion is insertable into the interior of the process cartridge through an exposure opening portion provided in the process cartridge for exposing the electrophotographic photosensitive member to light.

7. The disassembling tool according to claim 1, wherein the coupling member has a circular cross section, and said pushing-out portion has a cross section smaller in diameter than the cross section of the coupling member.

8. The disassembling tool according to claim 1, further comprising a biasing member provided between said pushing-out portion and said base body configured and positioned to bias said pushing-out portion and said base body away from each other.

9. The disassembling tool according to claim 2, further comprising a second grip portion connected to said engagement portion and configured and positioned to be gripped when said pushing-out portion is to be moved.

10. The disassembling tool according to claim 9, further comprising a second connecting bar configured and positioned to connect said base body and said second grip portion.

11. The disassembling tool according to claim 1, further comprising a second base body, a second pushing-out portion provided on said base body, and a second engagement portions provided on said second base body, whrein said first and second pushing-out portions push out the first coupling member and a second coupling member from the interior of the process cartridge to the outside of the process cartridge when first and second said engagement portions engage the process cartridge.

* * * * *

UNITED STATES PATENT AND TRADEMARK OFFICE

CERTIFICATE OF CORRECTION

PATENT NO. : 7,073,251 B2
APPLICATION NO. : 10/653229
DATED : July 11, 2006
INVENTOR(S) : Ken Kikuchi et al.

It is certified that error appears in the above-identified patent and that said Letters Patent is hereby corrected as shown below:

COVER PAGE AT ITEM [56] RC:
Foreign Patent Documents, “JP 2004101668 4/2004” should read --JP 2004-101668 4/2004--.

COLUMN 14:
Line 4, “portions” should read --portion--.

Signed and Sealed this

Third Day of February, 2009

JOHN DOLL
*Acting Director of the United States Patent and Trademark Office*